(12) United States Patent
Hu et al.

(10) Patent No.: US 12,225,276 B2
(45) Date of Patent: Feb. 11, 2025

(54) OPTICAL ELEMENT DRIVING MECHANISM

(71) Applicant: TDK TAIWAN CORP., Taoyuan (TW)

(72) Inventors: Hsiao-Hsin Hu, Taoyuan (TW); Shu-Shan Chen, Taoyuan (TW); Chao-Chang Hu, Taoyuan (TW); Pai-Jui Cheng, Taoyuan (TW); Chieh-An Chang, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 485 days.

(21) Appl. No.: 17/583,772

(22) Filed: Jan. 25, 2022

(65) Prior Publication Data
US 2022/0397737 A1 Dec. 15, 2022

Related U.S. Application Data

(60) Provisional application No. 63/209,750, filed on Jun. 11, 2021.

(51) Int. Cl.
| | |
|---|---|
| *H04N 23/54* | (2023.01) |
| *G01D 5/20* | (2006.01) |
| *G02B 7/02* | (2021.01) |
| *G02B 7/18* | (2021.01) |
| *G03B 13/34* | (2021.01) |
| *H01F 7/08* | (2006.01) |
| *H01F 27/28* | (2006.01) |
| *H02K 41/02* | (2006.01) |
| *H04N 23/55* | (2023.01) |
| *H04N 23/57* | (2023.01) |
| *H10N 30/20* | (2023.01) |
| *H10N 30/88* | (2023.01) |
| *G02B 7/04* | (2021.01) |

(52) U.S. Cl.
CPC .......... *H04N 23/54* (2023.01); *G01D 5/2046* (2013.01); *G02B 7/022* (2013.01); *G02B 7/023* (2013.01); *G02B 7/1805* (2013.01); *G03B 13/34* (2013.01); *H01F 7/081* (2013.01); *H01F 27/28* (2013.01); *H02K 41/02* (2013.01); *H04N 23/55* (2023.01); *H04N 23/57* (2023.01); *H10N 30/202* (2023.02); *H10N 30/88* (2023.02); *G02B 7/04* (2013.01); *H01F 2007/086* (2013.01)

(58) Field of Classification Search
None
See application file for complete search history.

(56) References Cited

U.S. PATENT DOCUMENTS 11,867,969 B2 * 1/2024 Ryoo .................... H02N 2/025
11,899,508 B2 * 2/2024 Guo ...................... G03B 30/00
(Continued)

*Primary Examiner* — Robert E. Tallman
(74) *Attorney, Agent, or Firm* — MUNCY, GEISSLER, OLDS & LOWE, P.C.

(57) ABSTRACT

An optical element driving mechanism is provided. The optical element driving mechanism includes a first holder, a fixed portion, a first driving assembly, and a first stopping assembly. The first holder is used for connecting to an optical element. The first holder is movable relative to the fixed portion. The first driving assembly is used for driving the first holder to move relative to the fixed portion. The first stopping assembly is used for restricting the movable range of the first holder relative to the fixed portion.

13 Claims, 17 Drawing Sheets

(56) References Cited

U.S. PATENT DOCUMENTS

| 2019/0113621 A1* | 4/2019 | Chen | G01S 17/89 |
| 2019/0258136 A1* | 8/2019 | Yu | G03B 17/17 |
| 2021/0278624 A1* | 9/2021 | Wang | G02B 27/646 |

* cited by examiner

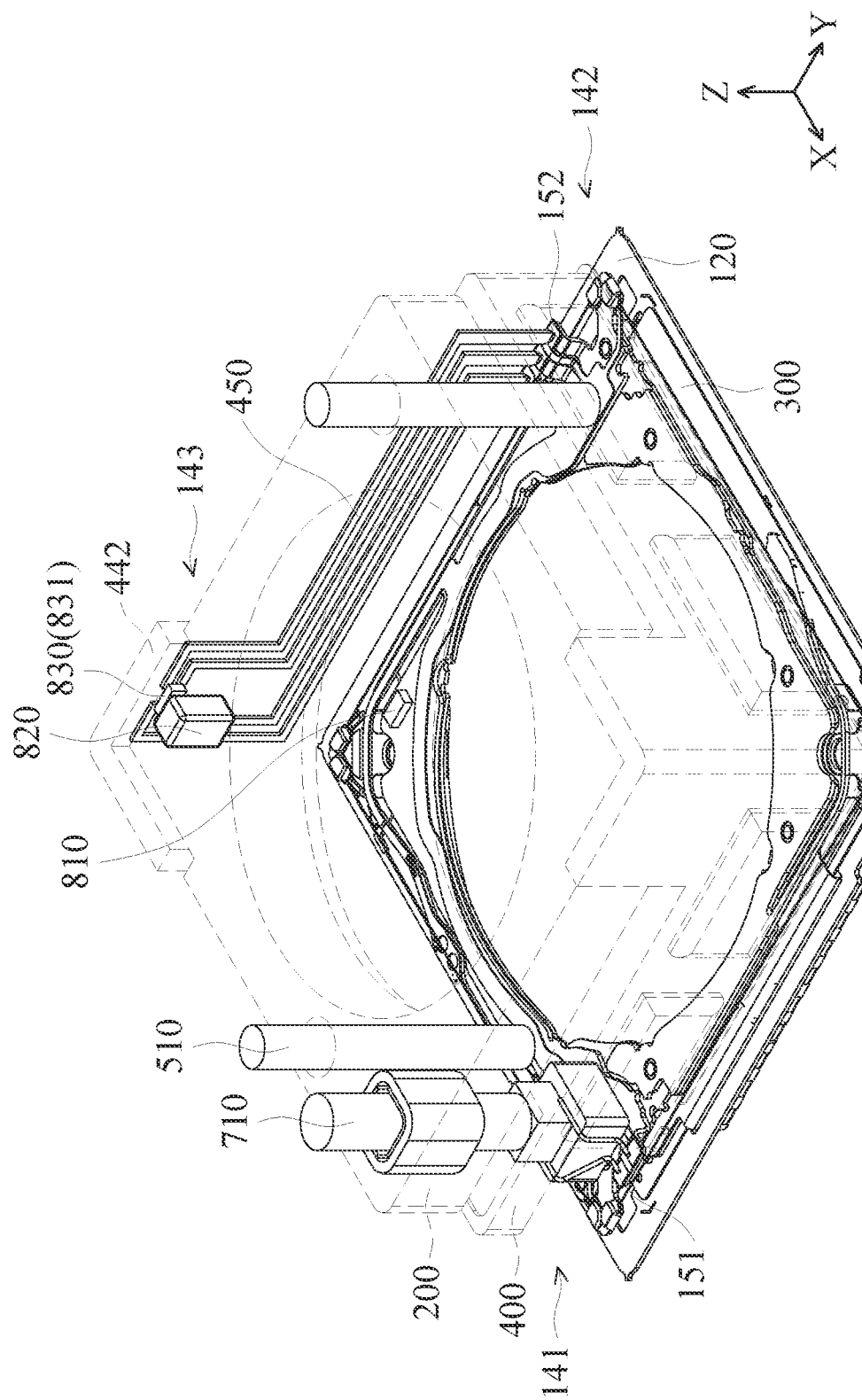

OPTICAL ELEMENT DRIVING MECHANISM

CROSS REFERENCE TO RELATED APPLICATIONS

This application claims the benefit of U.S. Provisional Application No. 63/209,750, filed on Jun. 11, 2021, the entirety of which is incorporated by reference herein.

BACKGROUND OF THE INVENTION

Field of the Invention

The present disclosure relates to an optical element driving mechanism.

Description of the Related Art

As technology has developed, it has become more common to include image-capturing and video-recording functions into many types of modern electronic devices, such as smartphones and digital cameras. These electronic devices are used more and more often, and new models have been developed that are convenient, thin, and lightweight, offering more choice to consumers.

Electronic devices that have image-capturing or video-recording functions normally include an optical element driving mechanism to drive an optical element (such as a lens) to move along its optical axis, thereby achieving auto focus (AF) or optical image stabilization (OIS). Light may pass through the optical element and may form an image on an optical sensor. However, the trend in modern mobile devices is to have a smaller size and a higher durability. As a result, how to effectively reduce the size of the optical element driving mechanism and how to increase its durability has become an important issue.

BRIEF SUMMARY OF THE INVENTION

An optical element driving mechanism is provided in some embodiments of the present disclosure. The optical element driving mechanism includes a first holder, a fixed portion, a first driving assembly, and a first stopping assembly. The first holder is used for connecting to an optical element. The first holder is movable relative to the fixed portion. The first driving assembly is used for driving the first holder to move relative to the fixed portion. The first stopping assembly is used for restricting the movable range of the first holder relative to the fixed portion.

In some embodiments, the fixed portion includes a top wall being plate-shaped and perpendicular to a main axis, a first side wall being plate-shaped and does not parallel to the top wall, and a base arranged with the top wall along the main axis. The top wall, the first side wall, and the base surround an accommodating space, and the accommodating space is used for accommodating the first holder. At least a portion of the first driving assembly is affixed on the first holder.

In some embodiments, the optical element driving mechanism further includes a second holder used for connecting the optical element and is movable relative to the fixed portion and the first holder, a second driving assembly used for driving the second holder to move relative to the first holder, and a bottom affixed on the first holder. When viewed along a first axis perpendicular to the main axis, at least a portion of the bottom is between the first holder and the second holder. When viewed along the first axis, at least a portion of the second driving assembly is between the bottom and the first holder. When viewed along the first axis, at least a portion of the second driving assembly is exposed from the bottom. The bottom has a first concave structure used for accommodating the second driving assembly.

In some embodiments, the second driving assembly includes a driving force source used for generating a driving force, a transferring element used for transferring the driving force, and a weighting element disposed on the transferring element. the material of the driving force source includes piezoelectric material. The material of the transferring element includes nonmetal materials. The transferring element is strip-shaped and extends in a second axis. The material of the weighting element includes metal. The driving force source is between the transferring element and the weighting element. The transferring element is disposed in a first opening of the bottom. The first bottom is formed on a first bottom surface and a third bottom surface of the bottom. The first bottom surface and the third bottom surface are perpendicular the second axis. The first side wall and the base is adjacent to the first concave structure. The driving force source is in the first concave structure. The weighting element is in the first concave structure.

In some embodiments, when viewed along the second axis, the maximum dimension of the first opening is different from the maximum dimension of the second opening. When viewed along the second axis, the maximum dimension of the first opening is less than the maximum dimension of the first guiding element. A first end of the guiding element is disposed in the second opening. When viewed along the second axis, the maximum dimension of the first opening is greater than $1/3$ of the maximum dimension of the first guiding element. A second end of the guiding element is free from in contact with any element.

In some embodiments, the optical element driving mechanism further includes a guiding assembly used for guiding the movement of the second holder relative to the bottom, and the guiding assembly includes: a first guiding element being strip-shaped and extending along in a direction parallel to the second axis, and a second guiding element being strip-shaped and extending along in a direction parallel to the second axis. When viewed along the second axis, the optical element driving mechanism is polygonal. When viewed along the second axis, the second driving assembly is position at a first corner of the optical element driving mechanism. When viewed along the second axis, the first guiding element is position at the first corner. When viewed along the second axis, the second guiding element is position at a second corner of the optical element driving mechanism. When viewed along the second axis, a connection between the first guiding element and the second guiding element passes a through hole of the second holder. The optical element is affixed in the through hole. When viewed along the first axis, at least a portion of the first guiding element overlaps the second driving assembly. A second opening forms on a second bottom surface of the bottom. The second opening forms on a fourth bottom surface of the bottom. The third bottom surface and the fourth bottom surface face the first holder. The second bottom surface and the fourth bottom surface are parallel. The bottom further includes a second concave structure formed on the second bottom surface and is adjacent to the second opening. When viewed along the main axis, the maximum dimension of the second concave structure is greater than the maximum dimension of the second opening. The second concave structure has a curvy surface. The bottom further includes a third concave structure formed on the fourth bottom surface and is adjacent to the second opening. When viewed along the main axis, the maximum dimension of the third concave structure is different from the maximum dimension of the second concave structure. The third concave structure has a flat surface. When viewed along the second axis, the maximum dimension of the first opening is less than the maximum dimension of the second opening. The material of the transferring element includes carbon.

In some embodiments, the optical element driving mechanism further includes a first connecting element at least partially disposed in the first concave structure, second connecting element at least partially disposed in the first concave structure, a third connecting element disposed between the bottom and the first holder, and a fourth connecting element used for connecting the transferring element and the bottom. The weighting element is affixed on a first concave structure surface through the first connecting element. The first connecting element is in direct contact with the weighting element. The first connecting element is in direct contact with the first recess structure surface. The first recess structure surface is parallel to the second axis. At least a portion of the first connecting element overlaps the weighting element in a direction perpendicular to the second axis. The weighting element is affixed on a second concave structure surface of the first concave structure through the second connecting element. The second connecting element is in direct contact with the weighting element. The second connecting element is in direct contact with the second recess structure surface. The second recess structure surface is not parallel to the second axis. When viewed along the second axis, at least a portion of the second connecting element overlaps the weighting element. The first recess structure surface is at the bottom. The second recess structure surface is at the first holder. The first connecting element is in direct contact with the second connecting element. The first connecting element and the second connecting element are formed as one piece. The bottom is affixed on the first holder through the third connecting element. The third connecting element is in direct contact with the first holder. The third connecting element is in direct contact with the bottom. At least a portion of the first guiding element overlaps the third connecting element in the direction that the second axis extends. The third connecting element is in direct contact with the first guiding element. At least a portion of the second guiding element overlaps the third connecting element in the direction that the second axis extends. The third connecting element is in direct contact with the second guiding element. The third connecting element is in direct contact with the second connecting element. The second connecting element and the third connecting element are formed as one piece. The material of the first connecting element includes nonmetal material. The material of the second connecting element includes nonmetal material. The material of the third connecting element includes nonmetal material. The fourth connecting element is in direct contact with the bottom. The fourth connecting element is disposed in the first opening. The Young's modulus of the fourth connecting element is different from the Young's modulus of the second connecting element. The Young's modulus of the fourth connecting element is different from the Young's modulus of the third connecting element. When viewed along the main axis, the maximum dimension of the third concave structure is greater than the maximum dimension of the second concave structure.

In some embodiments, the optical element driving mechanism further includes a second sensing assembly used for detecting the movement of the second holder relative to the bottom. When viewed along the main axis, the second driving assembly and the second sensing assembly are at different corners of the optical element driving mechanism. When viewed along the main axis, the first guiding element and the second sensing assembly are at different corners of the optical element driving mechanism. When viewed along the main axis, the second guiding element and the second sensing assembly are at different corners of the optical element driving mechanism. When viewed along the main axis, the second driving assembly is at a third corner of the optical element driving mechanism. The second sensing assembly includes a second reference element and a second sensing element. The second reference element and the second sensing element are respectively disposed on the second holder and the bottom. The Young's modulus of the fourth connecting element is less than the Young's modulus of the second connecting element. The Young's modulus of the fourth connecting element is less than the Young's modulus of the third connecting element.

In some embodiments, the optical element driving mechanism further includes a first circuit assembly affixed on the first holder, and a second control assembly electrically connected to the first circuit assembly. The first circuit assembly is electrically connected to the first driving assembly. The first circuit assembly is electrically connected to the second driving assembly. The first circuit assembly is electrically connected to the second sensing assembly. The second control assembly is used for providing as second driving signal to the second driving assembly. The second sensing assembly provides a second sensing signal to the second control assembly. When viewed along the second axis, the second control assembly is position at the third corner. The second control assembly is affixed on the first holder.

In some embodiments, the optical element driving mechanism further includes a second circuit assembly affixed on the bottom, a first electrical connecting portion connecting to the first circuit assembly and the second circuit assembly, and a second electrical connecting portion connecting to the first circuit assembly and the second circuit assembly. The second circuit assembly is electrically connected to the second driving assembly. The second circuit assembly is electrically connected to the second sensing assembly. The second driving assembly is electrically connected to the first circuit assembly through the second circuit assembly. The second sensing assembly is electrically connected to the first circuit assembly through the second circuit assembly. The second driving assembly is electrically connected to the second control assembly through the first circuit assembly. The second sensing assembly is electrically connected to the second control assembly through the first circuit assembly. The second driving signal is transmitted through the first electrical connecting portion. The second sensing signal is transmitted through the second electrical connecting portion. When viewed along the main axis, the first electrical connecting portion and the second electrical connecting portion are position at different corners of the optical element driving mechanism.

In some embodiments, the optical element driving mechanism further includes a fifth connecting element disposed on the first electrical connecting portion. The fifth connecting element is in direct with the second connecting element. The fifth connecting element is in direct with the third connecting element. The fifth connecting element and the second connecting element are formed as one piece. The fifth connecting element and the third connecting element are formed as one piece. The material of the first holder includes metal. The material of the second holder includes nonmetal materials. The material of the first driving assembly includes shape memory alloy. When viewed along the main axis, the first electrical connecting portion is at the first corner. When viewed along the main axis, the second electrical connecting portion is at the second corner.

In some embodiments, the optical element driving mechanism further includes a dust limiting structure used for limiting the movement of dust in the accommodating space, and the dust limiting structure includes a first dust capturing element used for capturing the dust, a second dust capturing element used for capturing the dust, and a third dust capturing element used for capturing the dust. The bottom further includes a first recess structure formed on the first bottom surface. The second holder further includes a second recess structure formed on the surface of the second holder facing the bottom. The surface of the first dust capturing element is sticky. The material of the first dust capturing element includes resin. When viewed along the second axis, the first dust capturing element surrounds the transferring element. The first recess structure is adjacent to the transferring element. The first dust capturing element is disposed in the first recess structure. In the direction that the first axis extends, the maximum dimension of the first recess structure is different from the maximum dimension of the second recess structure. In the direction that the second axis extends, at least a portion of the first recess structure overlaps the second recess structure. The second dust capturing element is movable relative to the first dust capturing element. When viewed along the second axis, the first dust capturing element and the second dust capturing element at least partially overlap each other. The third dust capturing element is disposed on the third bottom surface. A gap greater than zero is between the center of the first dust capturing element and the center of the third dust capturing element in a direction parallel to the second axis. The third dust capturing element surrounds the optical element when viewed along the second axis.

In some embodiments, the first stopping assembly includes a first stopping element used for limiting the movement of the first holder, and a second stopping element used for limiting the movement of the second holder. When viewed along the main axis, the bottom includes a first concave portion, and the first concave portion and the first stopping element are position at an identical side of the bottom. The first concave portion corresponds to the first side wall. The first stopping element is formed on the bottom. When viewed along the main axis, the second stopping element is at the second corner. When viewed along the main axis, the second stopping element and the second driving assembly are at different corners of the optical element driving mechanism. The second stopping element is formed on the bottom. The second sensing element is disposed on the second stopping element. In the direction that the first axis extends, the maximum dimension of the first recess structure is less than the maximum dimension of the second recess structure.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2B is a perspective views of some elements of the optical element driving mechanism.

DETAILED DESCRIPTION OF THE INVENTION

Figure 1A:
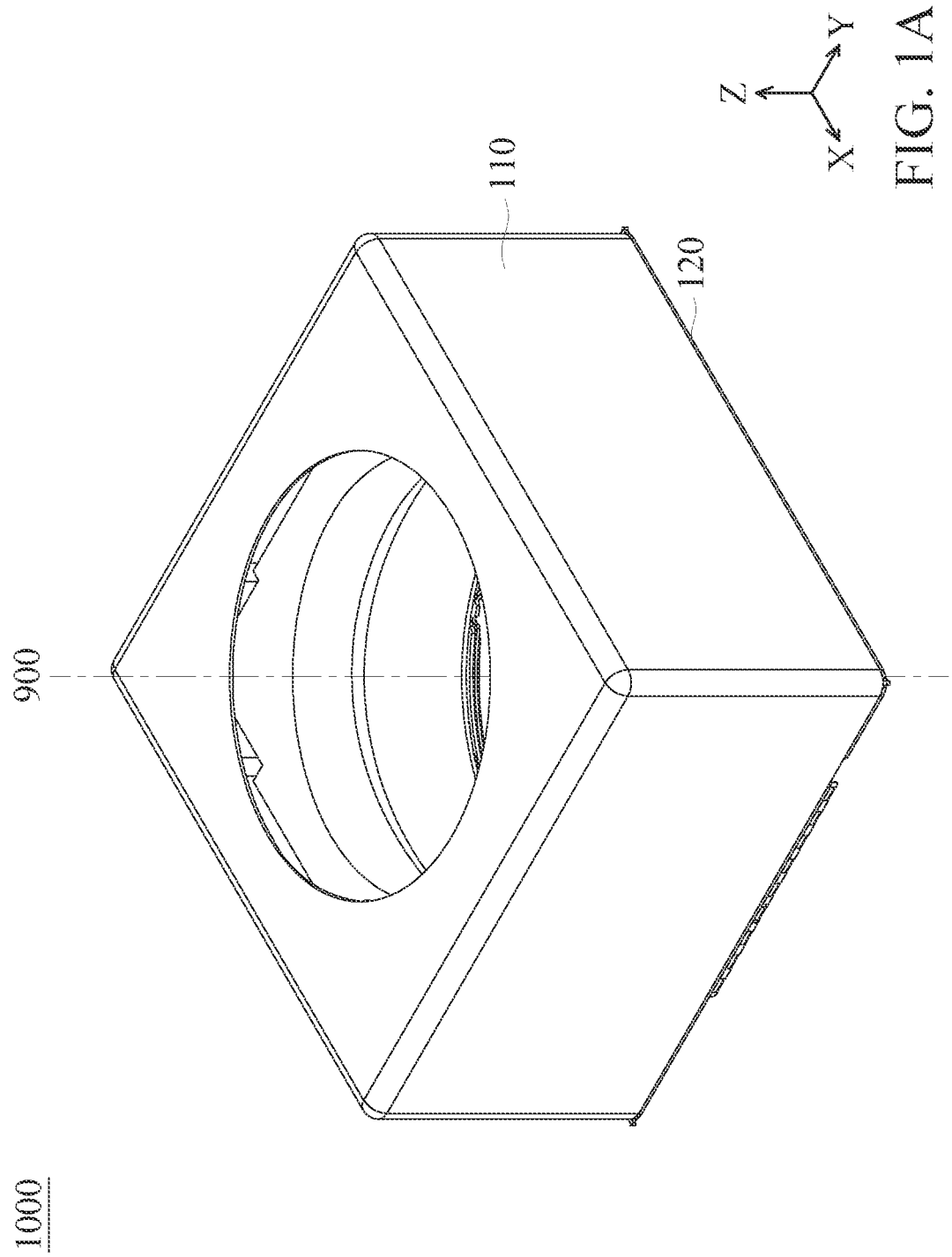
FIG. 1A is a schematic view of an optical element driving mechanism.

The following disclosure provides many different embodiments, or examples, for implementing different features of the provided subject matter. Specific examples of components and arrangements are described below to simplify the present disclosure. These are, of course, merely examples and are not intended to be limiting. For example, in some embodiments, the formation of a first feature over or on a second feature in the description that follows may include embodiments in which the first and second features are in direct contact, and may also include embodiments in which additional features may be disposed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are in direct contact, and may also include embodiments in which additional features may be disposed interposing the features, such that the features may not be in direct contact. In addition, spatially relative terms, for example, "vertical," "above." "over," "below,", "bottom," etc. as well as derivatives thereof (e.g., "downwardly." "upwardly," etc.) are used in the present disclosure for ease of description of one feature's relationship to another feature. The spatially relative terms are intended to cover different orientations of the device, including the features.

Unless defined otherwise, all technical and scientific terms used herein have the same meaning as commonly understood by one of ordinary skill in the art to which this disclosure belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

In addition, in some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

Figure 1B:
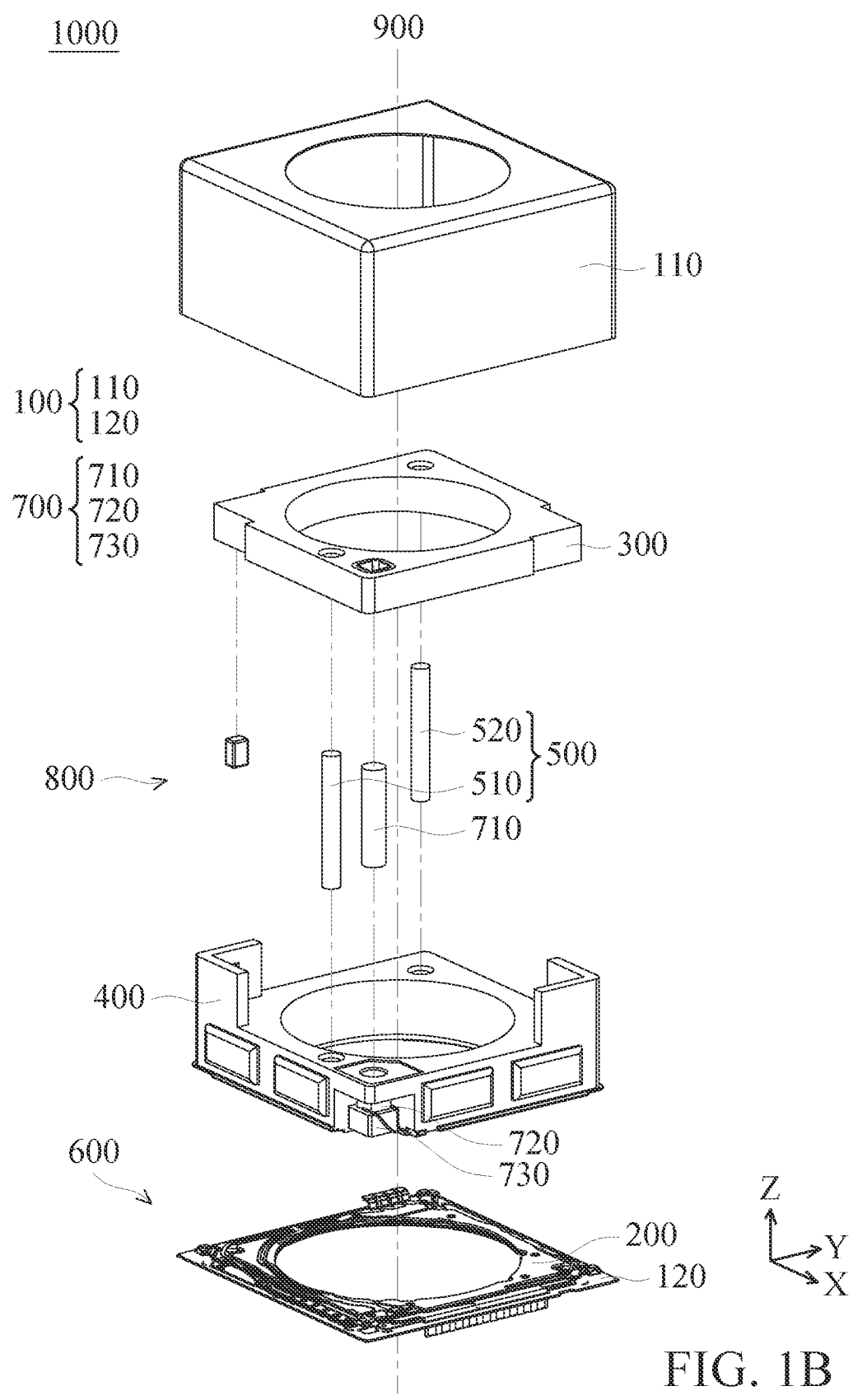
FIG. 1B is an exploded view of the optical element driving mechanism.
Figure 1C:
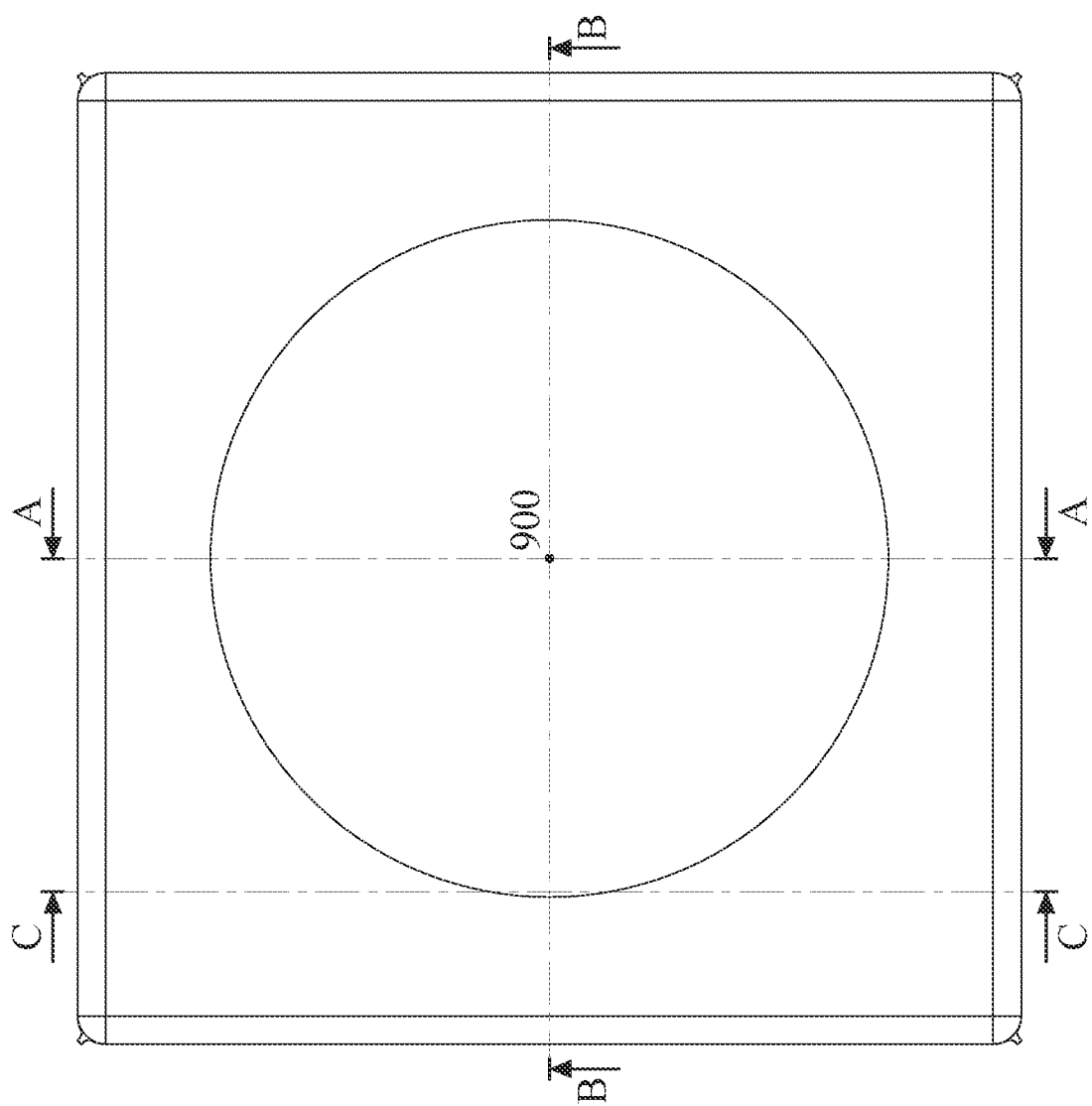
FIG. 1C is a top view of the optical element driving mechanism.
Figure 1D:
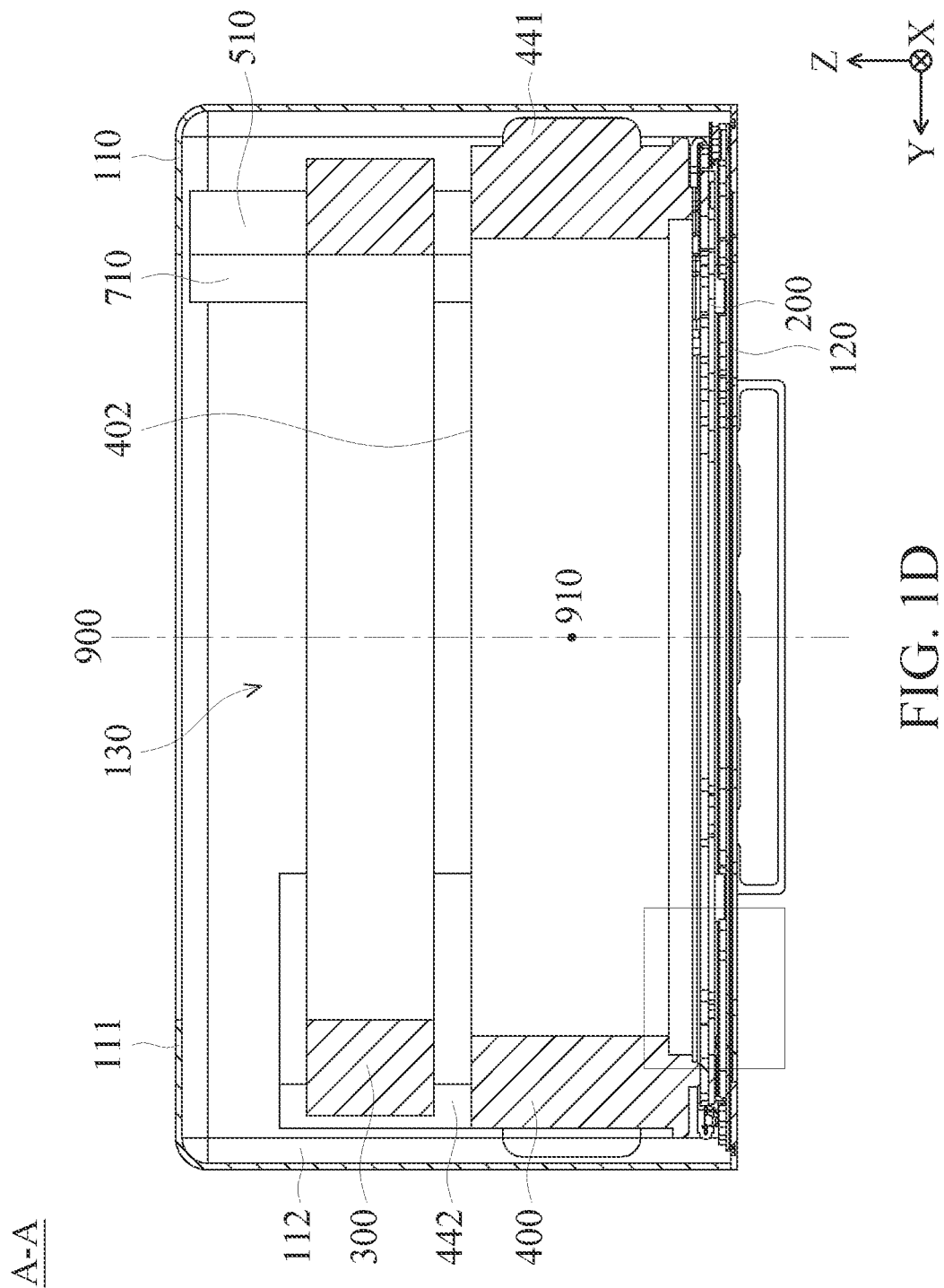
FIG. 1D is a cross-sectional view illustrated along the line A-A of FIG. 1C.
Figure 1E:
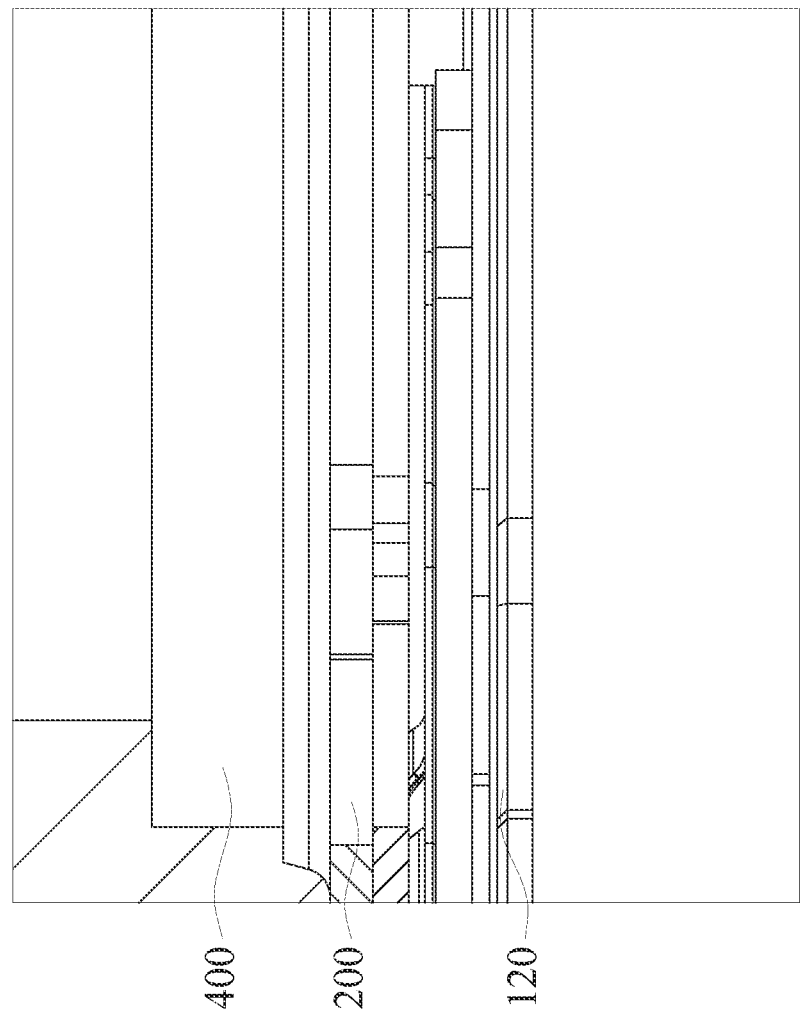
FIG. 1E is an enlarged view of FIG. 1D.
Figure 1F:
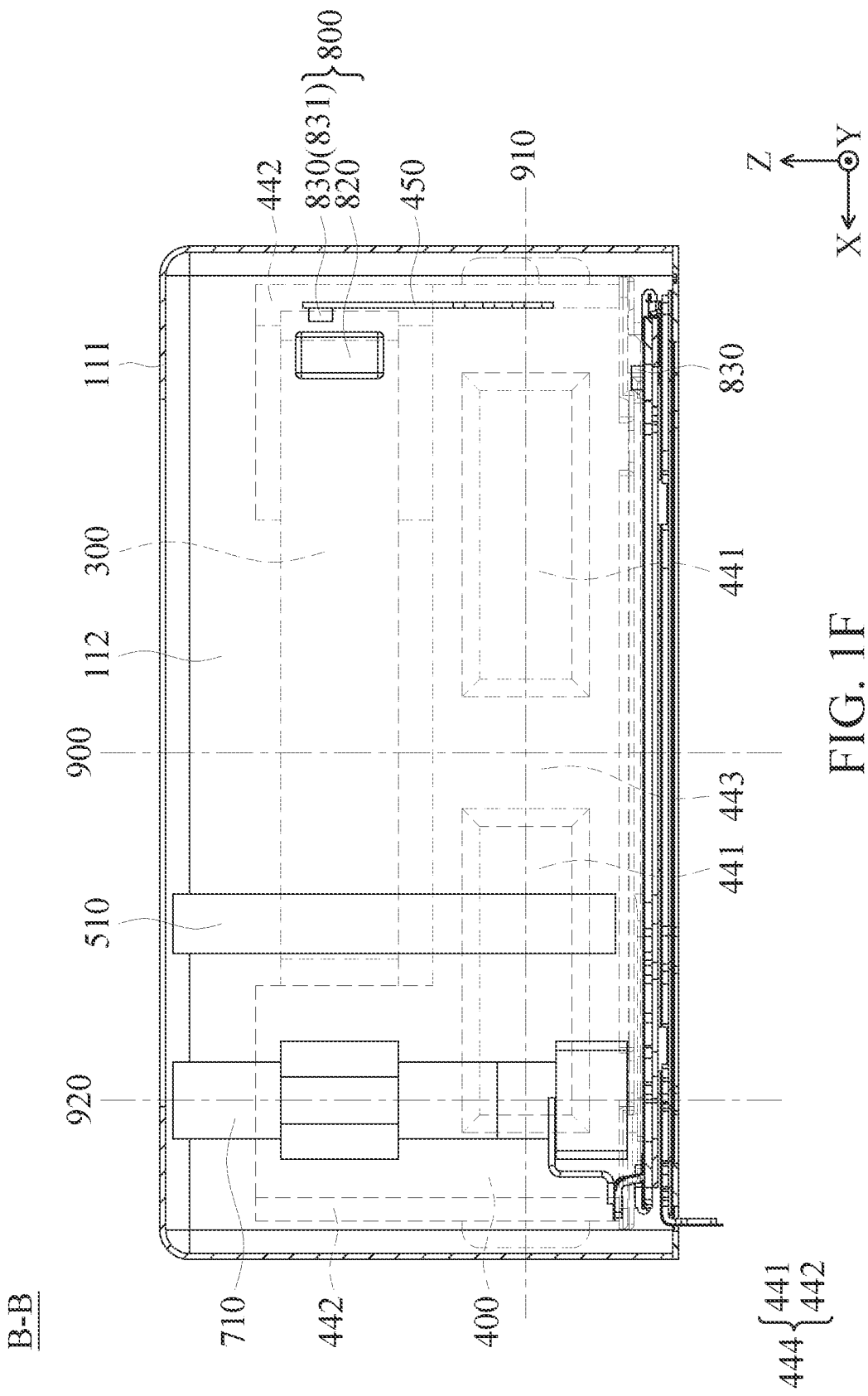
FIG. 1F is a cross-sectional view illustrated along the line B-B in FIG. 1C.
Figure 2A:
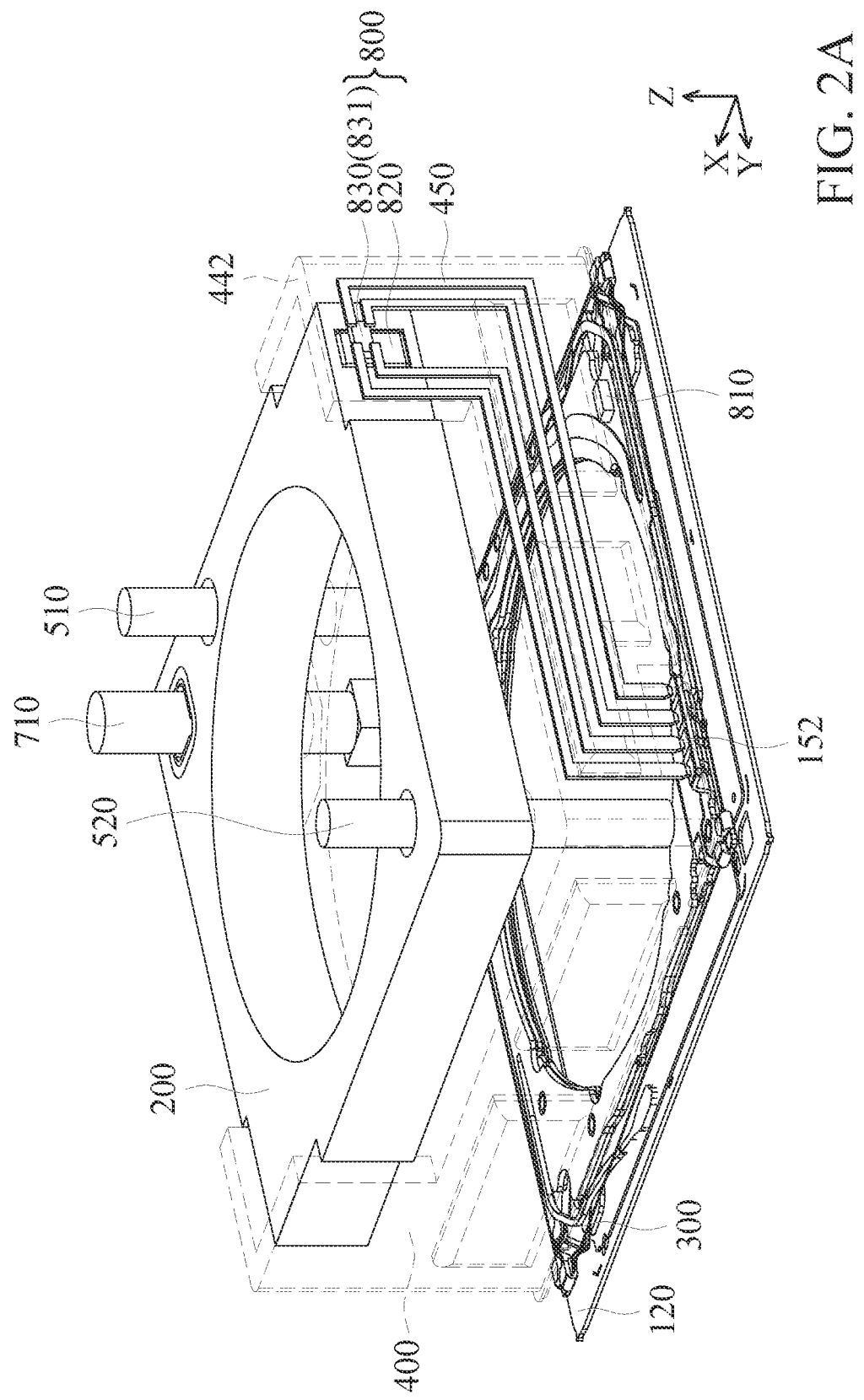
FIG. 2A is a perspective views of some elements of the optical element driving mechanism.

Refer to FIG. 1A to FIG. 1F. FIG. 1A is a schematic view of an optical element driving mechanism 1000. FIG. 1B is an exploded view of the optical element driving mechanism 1000. FIG. 1C is a top view of the optical element driving mechanism 1000. FIG. 1D is a cross-sectional view illustrated along the line A-A of FIG. 1C. FIG. 1E is an enlarged view of FIG. 1D. FIG. 1F is a cross-sectional view illustrated along the line B-B in FIG. 1C. FIG. 2A and FIG. 2B are perspective views of some elements of the optical element driving mechanism 1000.

As shown in FIG. 1A to FIG. 2B, the optical element driving mechanism 10X) mainly includes a fixed portion 100 (includes a case 110 and a base 120), a first holder 200, a second holder 300, a bottom 400, a guiding assembly 500 (includes a first guiding element 510 and a second guiding element 520), a first driving assembly 600, a second driving assembly 700 (includes a transferring element 710, a driving force source 720, and a weighting element 730), and a second sensing assembly 800 arranged along a main axis 900. The optical element driving mechanism 1000 is used for driving an optical element (not shown) to move to achieve auto focus (AF) or optical image stabilization (OIS).

In some embodiments, the optical element may include a lens, a mirror, a prism, a beam splitter, an aperture, a liquid lens, an image sensor, a camera module, or a ranging module. It should be noted that the definition of the optical element is not limited to the element that is related to visible light, and other elements that relate to invisible light (e.g. infrared or ultraviolet) are also included in the present disclosure.

The case 110 and the base 120 may be combined with each other to form a shell of the optical element driving mechanism 1000. For example, the base 120 may be fixed on the case 110. It should be noted that a case opening and a base opening are formed on the case 110 and the base 120, respectively. The center of the case opening corresponds to a main axis 900 of the optical element, and the base opening corresponds to an image sensor (not shown) outside the optical element driving mechanism 1000. As a result, the optical element disposed in the optical element driving mechanism 1000 can perform image focusing with the image sensor along the main axis 900.

The first holder 200 and the second holder 300 may be used for connecting to the optical element. Specifically, the first holder 200 is movable relative to the fixed portion 100, and the bottom 400 may be affixed on the first holder 200. The second holder 300 is movably connected to the bottom 400. In other words, the second holder 300 is movable relative to the fixed portion 100 and the bottom 400. The optical element may be affixed in a through hole 320 of the second holder 300 to move with the second holder 30X). The first driving assembly 600 may be used for driving the first holder 200 to move relative to the fixed portion 100. The second driving assembly 700 may be used for driving the second holder 300 to move relative to the fixed portion 100 and the bottom 400. As shown in FIG. 1E, the first holder 200 may be between the base 120 and the bottom 400. In some embodiments, the material of the first holder 200 may include metal materials, and the material of the second holder 300 may include non-metal materials.

The case 110 may include a top wall 111 and a plurality of sidewalls extending from the top wall 111, such as a first side wall 112. The top wall 111 is plate-shaped and is perpendicular to the main axis 900. The first side wall 112 is plate-shaped and is not parallel to the top wall 111. The base 120 may arrange with the top wall 111 along the main axis 900. The top wall 111, the first side wall 112, and the base 120 may surround an accommodating space 130. The accommodating space 130 may be used for accommodating elements of the optical element driving mechanism 1000, such as the first holder 200 or the second holder 300. In some embodiments, at least a portion of the first driving assembly 600 may be affixed on the second holder 300, such as the first driving assembly 600 may connect the base 120 and the second holder 300.

An axis passing through the center of the bottom 400 and is perpendicular to the main axis 900 may be defined as a first axis 910, such as an axis extending in the X direction. When viewed along the first axis 910, as shown in FIG. 1D, at least a portion of the bottom 400 is between the first holder 200 and the second holder 300, at least a portion of the second driving assembly 700 is between the first holder 200 and the bottom 400, and at least a portion of the second driving assembly 700 is exposed from the bottom 400. When viewed along the first axis 910, at least a portion of the first guiding element 510 overlaps the second driving assembly 700 (e.g. the transferring element 710).

The transferring element 710 of the second driving assembly 700 may be used for transmitting the driving force generated by the driving force source 720, and the weighting element 730 may be disposed on the driving force source 720. The driving force source 720 may be between the transferring element 710 and the weighting element 730. The transferring element 710 may be strip-shaped and extending along the second axis 920. The transferring element 710 may include non-metal material, such as carbon (e.g. graphite). Therefore, the transferring element 710 may disposed on the second holder 30) by friction contact. The second holder 300 and the transferring element 710 may move together when the force between the second holder 300 and the transferring element 710 is less than the maximum static friction, and the second holder 300 may move relative to the transferring element 710 may move together when the force between the second holder 30) and the transferring element 710 is higher than the maximum static friction.

The second axis 920 may be parallel to the main axis 900, but it is not limited thereto. In some embodiments, the driving force source 720 may form of piezoelectric materials. That is to say, when an electric field (voltage) is applied to the surface of the driving force source 720, the electric dipole moment of the driving force source 720 may be elongated, and the driving force source 720 is resistant to changes and will extend along the electric field direction. Therefore, electrical energy may convert into mechanical energy. In some embodiments, an electric field may be applied to the driving force source 720, so that the length of the driving force source 720 in the direction that the second axis 920 extends may be changed (e.g., elongated or shortened). The material of the weighting element 730 may include heavier metal, such as tungsten steel or iron, to stabilize the second driving assembly 700.

In some embodiments, the guiding assembly 500 may be used for guiding the movement of the first holder 200 relative to the bottom 400. The first guiding element 510 and the second guiding element 520 may pass through the second holder 300 and the bottom 400 and extend in the second axis 920. For example, the first guiding element 510 and the second guiding element 520 may be affixed on the bottom 400 and movably connected to the second holder 300 to guide the moving direction of the second holder 300 relative to the bottom 400. When viewed along the second axis 920, the bottom 400 is polygonal, the first guiding element 510 and the second driving assembly 70) are at a first corner 141 of the optical element driving mechanism 1000, the second guiding element 520 is at a second corner 142 of the optical element driving mechanism 1000, and a connection 530 between the first guiding element 510 and the second guiding element 520 passes through the through hole 320 of the second holder 300.

Figure 3:
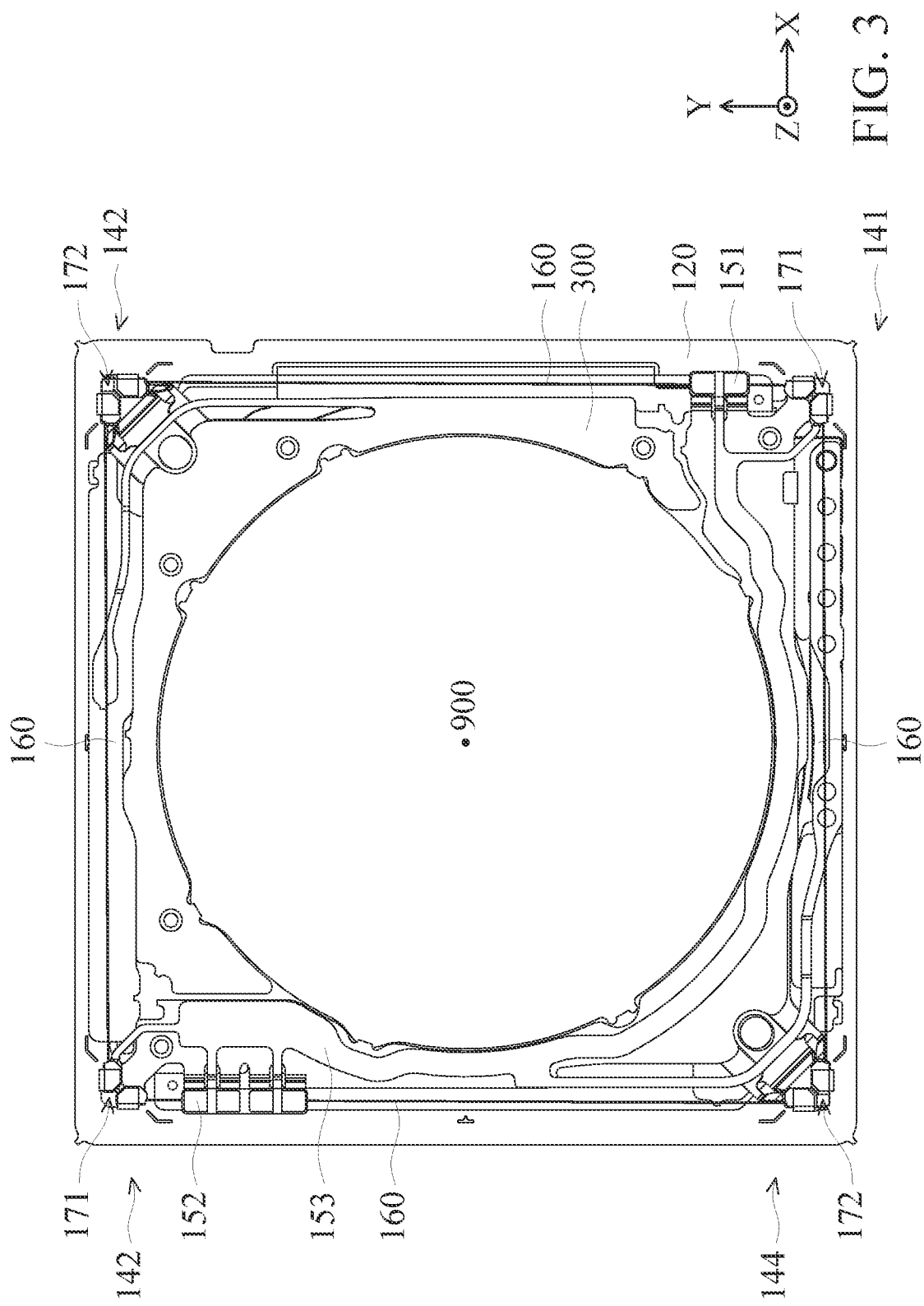
FIG. 3 is a top view of the base, the first holder, and the first driving assembly.

FIG. 3 is a top view of the base 120, the first holder 200, and the first driving assembly 600. The optical element driving mechanism 1000 may be polygonal, and may include a first corner 141, a second corner 142, a third corner 143, and a fourth corner 144. The first corner 141 and the second corner 142 are opposite, and the third corner 143 and the fourth corner 144 are opposite. In some embodiments, the first circuit assembly 153 may be disposed on the first holder 200, such as on the surface of the first holder 200, or embedded in the first holder 200.

The first circuit assembly 153 may be electrically connected to the first driving assembly 600, the second driving assembly 700, and the second sensing assembly 800. The first driving assembly 600 may include a plurality of first driving elements 160, and the first driving elements 160 may be strip-shaped. The first connecting portion 171 may position at the first corner 141 and the second corner 142, and the second connecting portion 172 may at the third corner 143 and the fourth corner 144. The first connecting portion 171 may connect to the first holder 200, and the second connecting portion 172 may connect to the base 120. An end of the first driving element 160 may be disposed in the first connecting portion 171, and another end of the first driving element 160 may be disposed in the second connecting portion 172. In other words, the first holder 200 may connect to the base 120 through the first driving assembly 600.

In some embodiments, the material of the first driving element 160 may include shape memory alloy (SMA). Shape memory alloy is an alloy that can eliminate the deformation in lower temperature by heating. When the shape memory alloy performs plastic deformation under its phase transition temperature, it may return to its original shape by heating.

In some embodiments, when a signal (e.g. voltage or current) is provided to the first driving element 160, the temperature may be increased by the thermal effect of a current, so that the length of the first driving element 160 may be decreased. On the contrary, if a signal having a lower intensity is provided which makes the heating rate lower than the heat dissipation rate of environment, the temperature of the first driving element 160 may be decreased, and the length may be increased. Therefore, the first driving assembly 600 may drive the first holder 200 to move relative to the fixed portion 100. For example, the first driving assembly 600 may drive the first holder 200 to move in a plane perpendicular to the main axis 900 (e.g. translational movement or rotation) to achieve optical image stabilization.

In some embodiments, the first driving element 160 may position in a virtual plane (not shown), such as a plane with a normal vector in the Z direction. Therefore, the force provided by the first driving assembly 600 to the first holder 200 may be controlled in the XY plane.

In some embodiments, additional circuits may be provided on the base 120, such as embedded in the base 120 or exposed from the surface of the base 120. The first electrical connecting portion 151 and the second electrical connecting portion 152 may be electrically connected to the circuits, and the circuit connected to the first electrical connecting portion 151 and the circuit connected to the second electrical connecting portion 152 may be electrically isolated from each other, but it is not limited thereto.

In some embodiments, a first stopping assembly 444 (e.g. including a first stopping element 441 and a second stopping element 442) may be provided on the bottom 400. The first stopping assembly 444 may restrict the movable range of the first holder 200 or the second holder 300 relative to the fixed portion 100 or the bottom 400. A first concave portion 443 may be provided between the two first stopping element 441, and the first stopping element 441 and the first concave portion 443 may be provided on an identical side of the bottom 400 to prevent a single and large first stopping element 441 being absorbed on the case 110.

In some embodiments, the first concave portion 443 may correspond to the first side wall 112 (e.g. facing the first side wall 112). The second stopping element 442 may position at the second corner 142, and the second stopping element 442 may position at a different corner of the optical element driving mechanism 1000 to the first guiding element 510, the second guiding element 520, and the second driving assembly 700. Therefore, the space at the corners of the optical element driving mechanism 1000 may be further utilized, miniaturization may be achieved, and the elements may move smoothly.

Figure 4A:
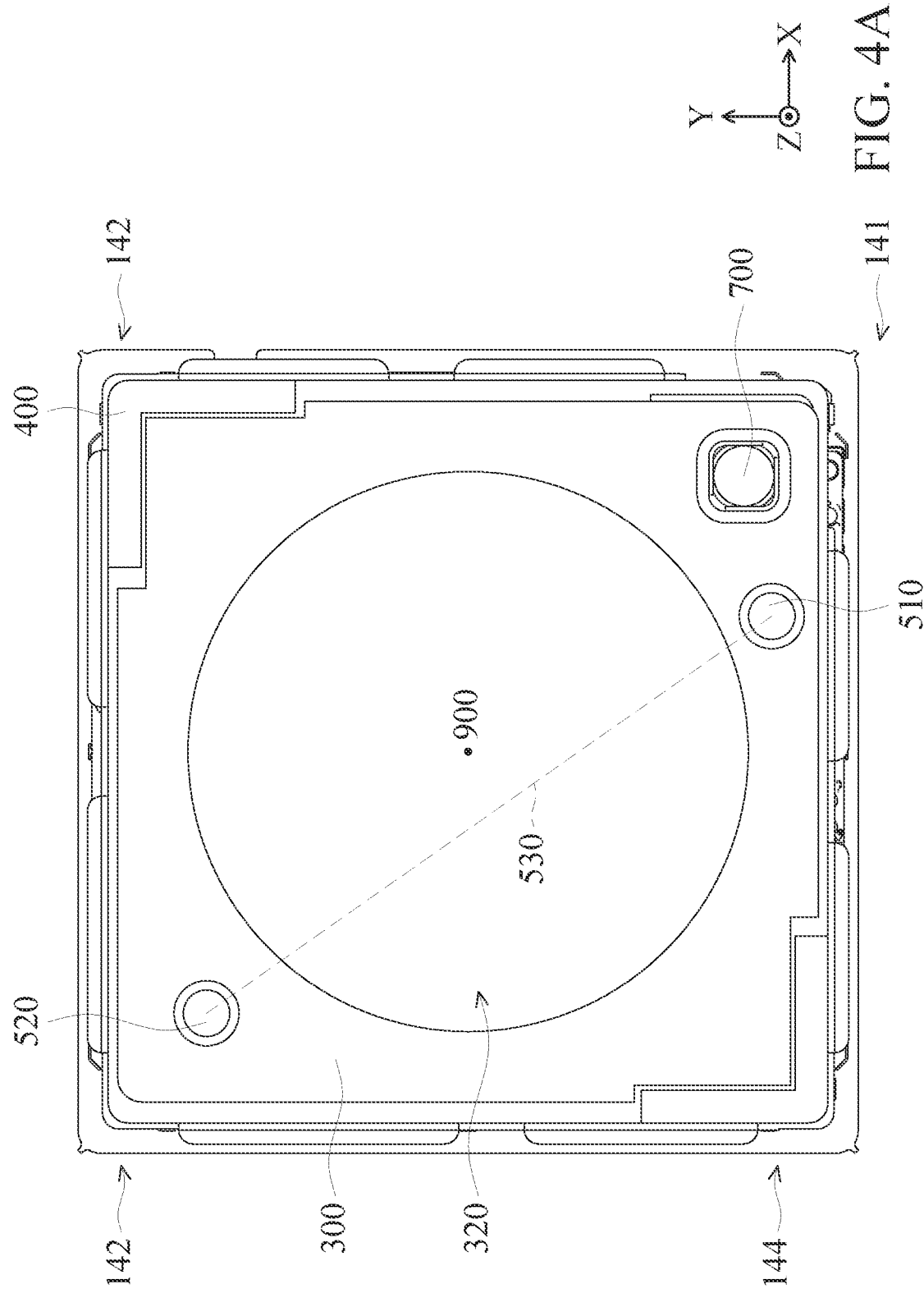
FIG. 4A is a top view of some elements of the optical element driving mechanism.
Figure 4B:
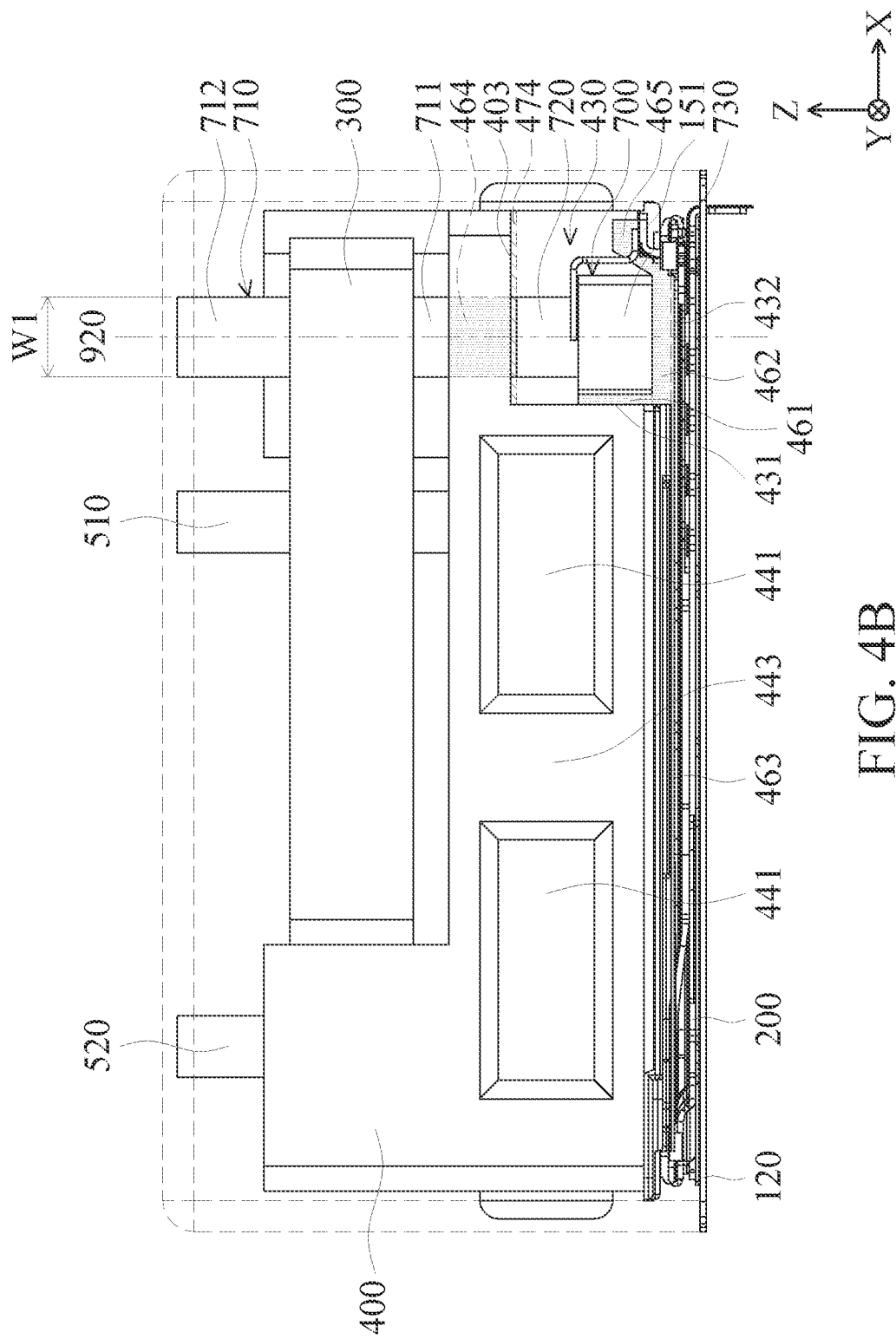
FIG. 4B is a side view of some elements of the optical element driving mechanism.
Figure 4C:
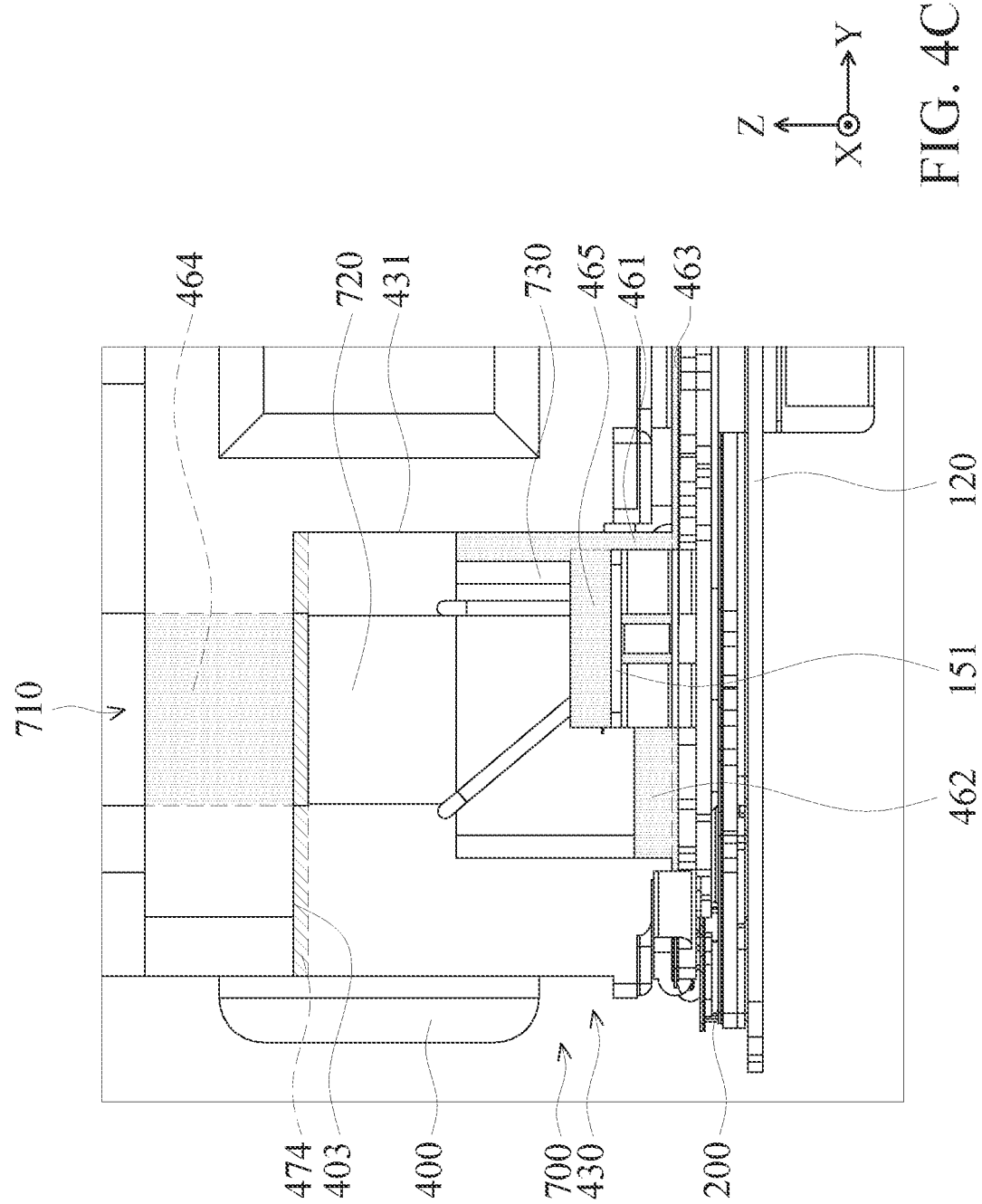
FIG. 4C is an enlarged side view of some elements of the optical element driving mechanism.
Figure 4D:
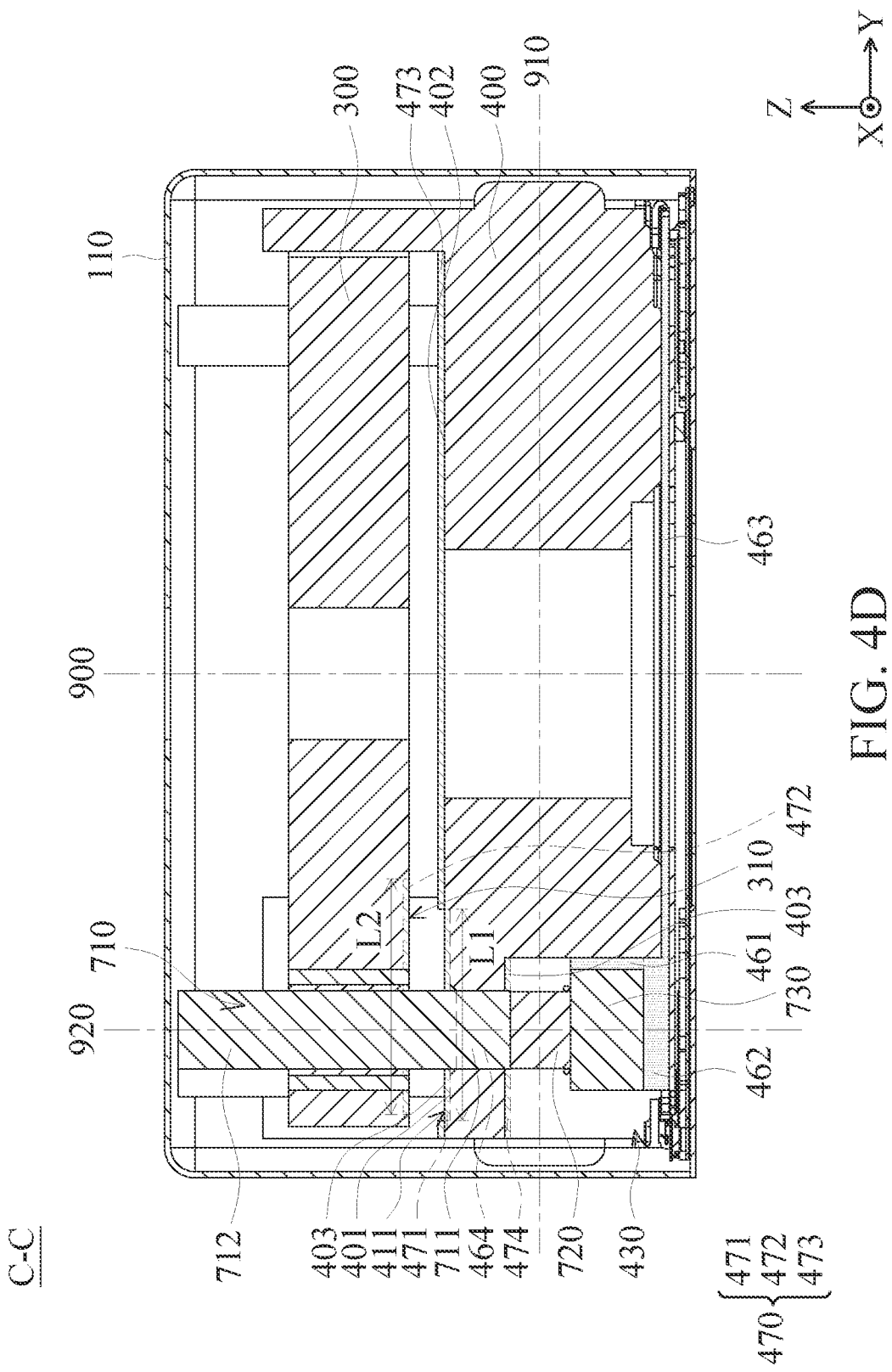
FIG. 4D is a cross-sectional view illustrated along the line C-C in FIG. 1C.

FIG. 4A is a top view of some elements of the optical element driving mechanism 1000. FIG. 4B is a side view of some elements of the optical element driving mechanism 1000. FIG. 4C is an enlarged side view of some elements of the optical element driving mechanism 1000. FIG. 4D is a cross-sectional view illustrated along the line C-C in FIG. 1C.

In some embodiments, the bottom 400 may include a first concave structure 430 used for accommodating a portion of the second driving assembly 7M). For example, the first side wall 112 and the base 120 are adjacent to the first concave structure 430, and the driving force source 720 and the weighting element 730 may in the first concave structure 430.

Figure 5A:
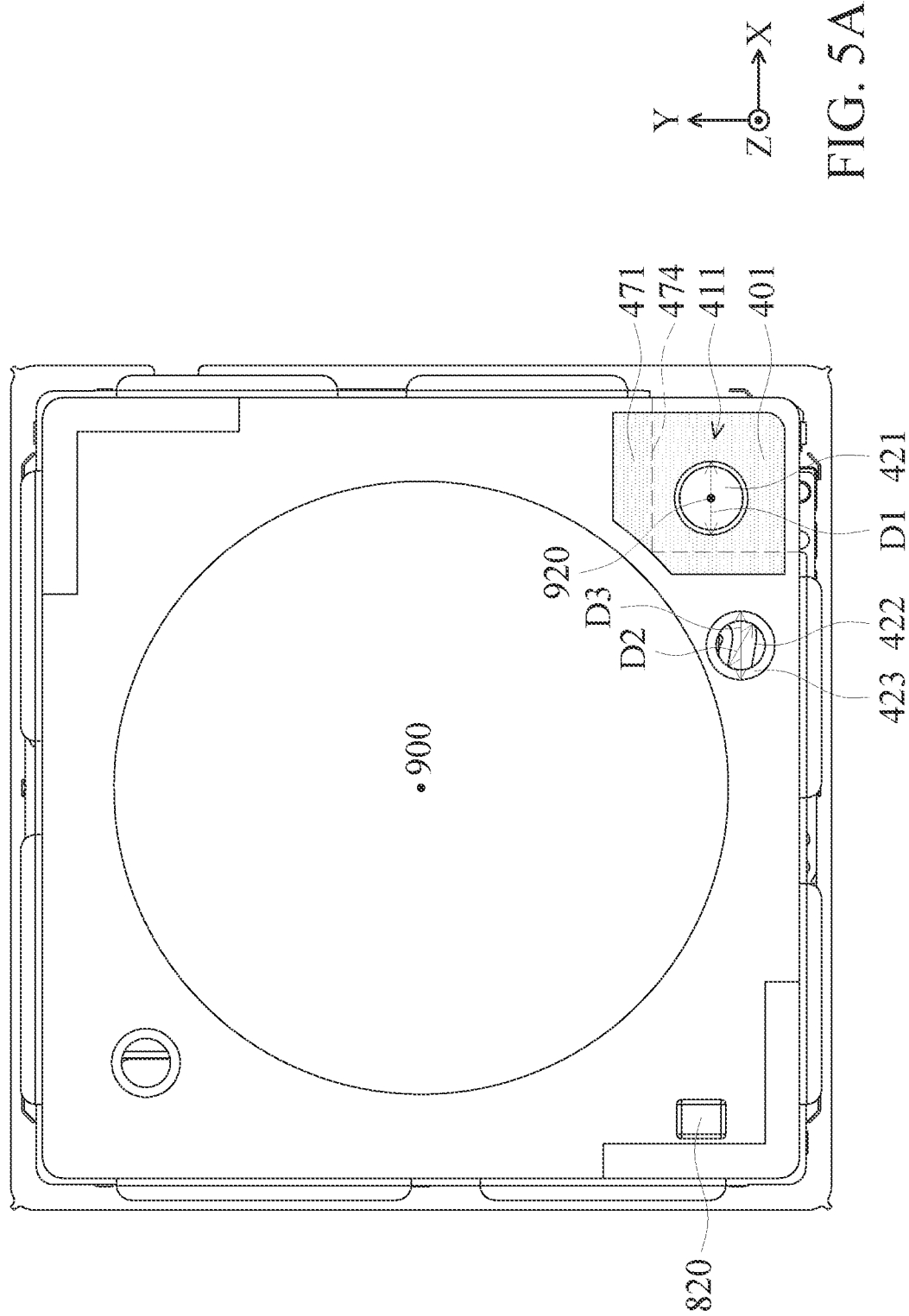
FIG. 5A is a schematic view of some elements of the optical element driving mechanism.
Figure 5B:
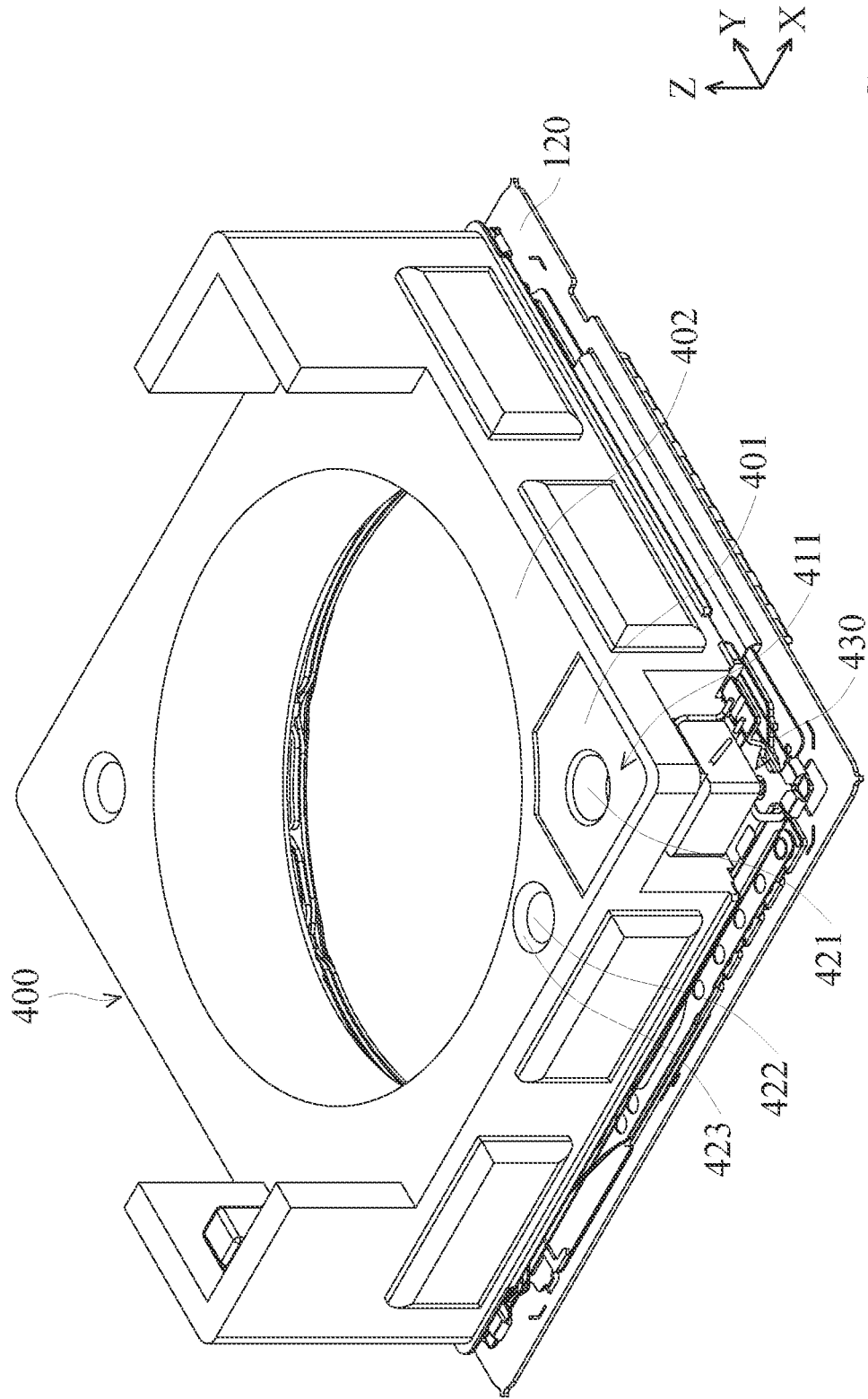
FIG. 5B is a schematic view of some elements of the optical element driving mechanism.

FIG. 5A and FIG. 5B are schematic views of some elements of the optical element driving mechanism 1000.

Figure 6A:
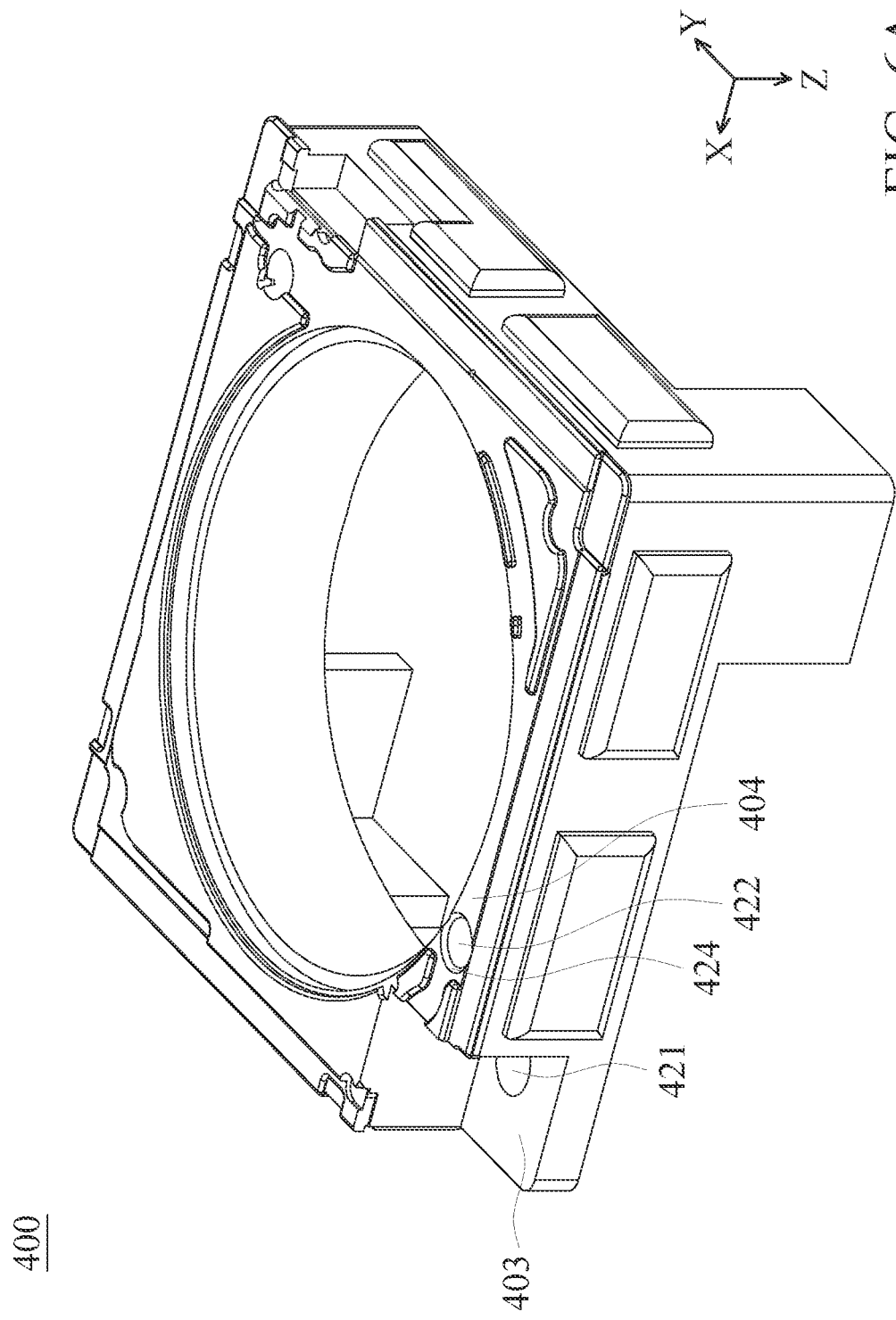
FIG. 6A and FIG. 6B are schematic views of the bottom viewed in different directions.
Figure 6B:
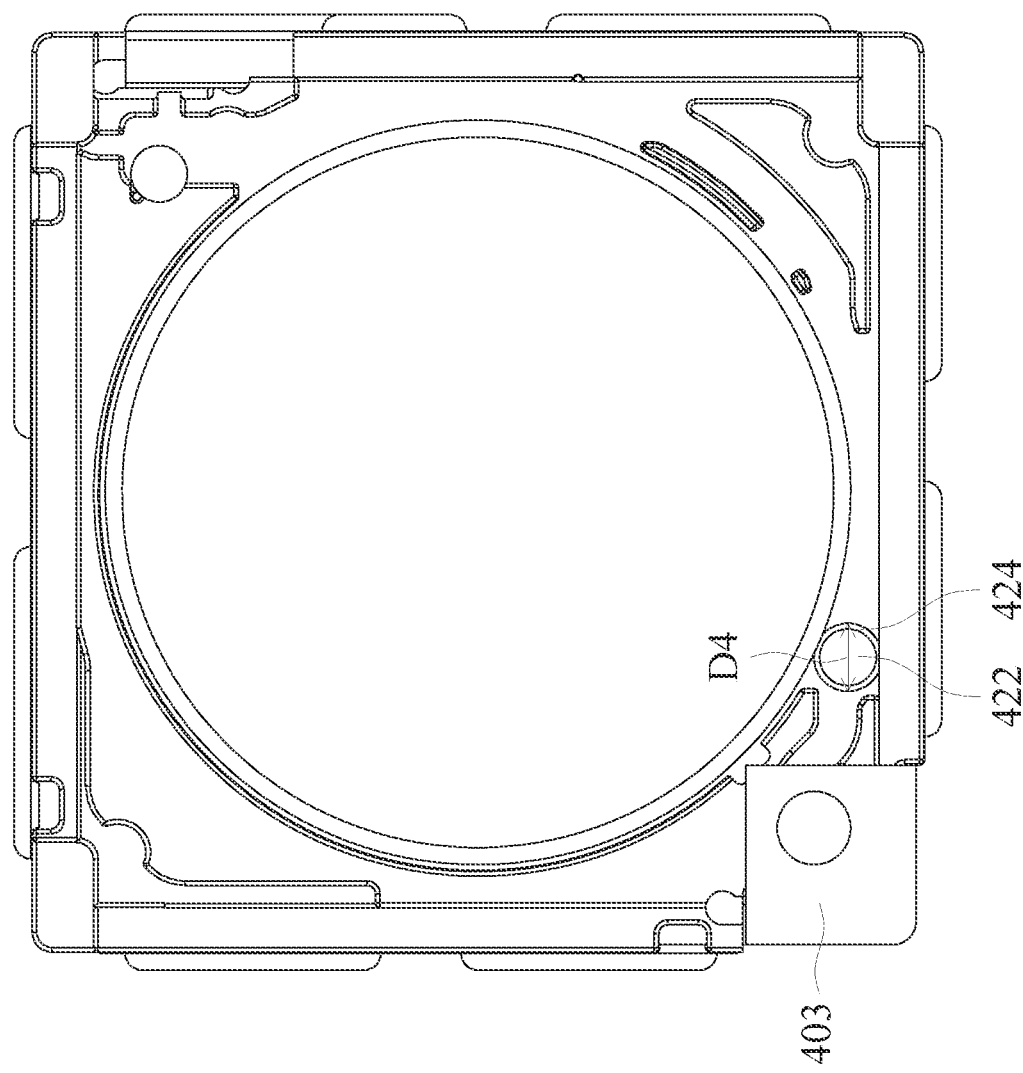

FIG. 6A and FIG. 6B are schematic views of the bottom 400 viewed in different directions. The bottom 400 may include a first bottom surface 401, a second bottom surface 402, a third bottom surface 403, a 404, a first opening 421, and a second opening 422. The first bottom surface 401, the second bottom surface 402, the third bottom surface 403, and the 404 may be parallel and perpendicular to the second axis 920. The first opening 421 may position at the first bottom surface 401 and the third bottom surface 403, and the second opening 422 may position at the second bottom surface 402 and the 404. The first bottom surface 401 and the second bottom surface 402 may face away from the first holder 200, and the third bottom surface 403 and the 404 may face the first holder 200.

The first opening 421 may be used for accommodating the transferring element 710, and the second opening 422 may be used for accommodating the first guiding element 510. As shown in FIG. 5A, when viewed along the second axis 920, the maximum dimension D1 of the first opening 421 is different from the maximum dimension D2 of the second opening 422, such as the maximum dimension D1 may be less than the maximum dimension D2. Moreover, the maximum dimension D1 of the first opening 421 may be less than the maximum dimension W1 of the transferring element 710 to allow the transferring element 710 being tightly fitted in the first opening 421.

For example, a first end 711 of the transferring element 710 may be disposed in the first opening 421, and a second end 712 of the transferring element 710 may be exposed from the first opening 421 and does not in contact with any element. In other words, no additional fixing means is required for the second end 712. In some embodiments, the maximum dimension D1 of the first opening 421 may be higher than ⅓ of the maximum dimension W1 of the transferring element 710 to allow the transferring element 710 being disposed in the first opening 421.

In some embodiments, the bottom 400 may further include a second concave structure 423 and a third concave structure 424. The second concave structure 423 is formed on the second bottom surface 402, and the third concave structure 424 may be formed on the 404. The second concave structure 423 and the third concave structure 424 may be adjacent to the second opening 422. When viewed along the main axis 900, the second concave structure 423 has a curvy surface (e.g. a rounded angle). The maximum dimension D3 of the second concave structure 423 may be higher than the maximum dimension D2 of the second opening 422. Moreover, the third concave structure 424 may have a flat surface (e.g. a chamfer), and the D4 of the third concave structure 424 may be higher than the maximum dimension D2 of the second opening 422. It should be noted that the second concave structure 423 and the third concave structure 424 may have different structures (e.g. a rounded angle and a chamfer). In some embodiments, when viewed along the main axis 900, the D4 of the second concave structure 423 is different from the maximum dimension D3 of the second opening 422, such as the D4 of the second concave structure 423 may be higher than the maximum dimension D3 of the second opening 422.

Moreover, the optical element driving mechanism 1000 may include a first connecting element 461, a second connecting element 462, a third connecting element 463, a fourth connecting element 464, and a fifth connecting element 465. The fourth connecting element 464 and the second connecting element 462 may be at least partially disposed in the first concave structure 430. The third connecting element 463 may be disposed between the bottom 400 and the first holder 200. The fourth connecting element 464 may be used for connecting the transferring element 710 and the bottom 400. The weighting element 730 may be affixed on a first concave portion surface 431 of the first concave structure 430 through the first connecting element 461. For example, the first concave portion surface 431 may be a surface of the first concave structure 430 parallel to the second axis 920. In other words, the first connecting element 461 may be in direct contact with the weighting element 730 and the first concave portion surface 431, and the first concave portion surface 431 and the weighting element 730 at least partially overlap each other in a direction perpendicular to the second axis 920 (e.g. the X or Y direction).

In some embodiments, the weighting element 730 may be affixed on the second concave portion surface 432 of the first concave structure 430 through the second connecting element 462, and the second concave portion surface 432 may be a surface of the first holder 200. In other words, the second connecting element 462 may be in direct contact with the weighting element 730 and the second concave portion surface 432, and the second concave portion surface 432 is not parallel to the second axis 920 (e.g. may be perpendicular). In some embodiments, at least a portion of the second connecting element 462 overlaps the weighting element 730 when viewed along the second axis 920. In some embodiments, the first connecting element 461 may be in direct contact with the second connecting element 462, and the first connecting element 461 and the second connecting element 462 may be formed as one piece.

In some embodiments, the bottom 400 may be affixed on the first holder 200 through the third connecting element 463. In other words, the third connecting element 463 may be in direct contact with the first holder 200 and the bottom 400. In a direction that the second axis 920 extends (the Z direction), the first guiding element 510 and the second guiding element 520 may be at least partially overlap the third connecting element 463. For example, the third connecting element 463 may be in direct contact with the first guiding element 510 and the second guiding element 520 to fix the relative position of the first guiding element 510, the second guiding element 520, and the bottom 400. In some embodiments, the third connecting element 463 may be in direct contact with the second connecting element 462 and may be formed as one piece. In some embodiments, the materials of the first connecting element 461, the second connecting element 462, and the third connecting element 463 may include nonmetal materials to prevent short circuit.

In some embodiments, the fourth connecting element 464 may in direct contact with the transferring element 710 and the first opening 421 of the bottom 400. The Young's modulus of the fourth connecting element 464 is different from the Young's modulus of the second connecting element 462 and the third connecting element 463, such as the Young's modulus of the fourth connecting element 464 may be less than the Young's modulus of the second connecting element 462 and the third connecting element 463. That is to say, the fourth connecting element 464 may be softer than the second connecting element 462 and the third connecting element 463 to allow the transferring element 710 being movably connected to the bottom 400.

In some embodiments, as shown in FIG. 1F, FIG. 2A, and FIG. 2B, the second sensing assembly 800 may include a second reference element 820 and a second sensing element 830 used for detecting the movement of the second holder 300 relative to the bottom 400. In some embodiments, a first sensing element 810 may be disposed on the first holder 200. The first sensor 810 also may be used for detecting the magnetic field variation of the second reference element 820, and the first sensing element 810 and the second sensing element 830 are disposed on different sides of the second reference element 820 to detect the movement of the second holder 300 relative to the bottom 400 in different directions. For example, the first sensing element 810 and the second sensing element 830 may include a Hall sensor, a magnetoresistance effect sensor (MR sensor), a giant magnetoresistance effect sensor (GMR sensor), a tunneling magnetoresistance effect sensor (TMR sensor), or a fluxgate sensor. The second reference element 820 may include magnet.

The second sensing element 830 and the second reference element 820 may be respectively disposed on the second holder 300 and the bottom 400 (or their positions may be interchanged). For example, the second sensing element 830 may be disposed on the second stopping element 442. When the second holder 300 moves relative to the bottom 400, the second sensing element 830 may be used for detecting the variation of the magnetic field of the second reference element 820, so the position of the second holder 300 relative to the bottom 400 may be achieved.

In some embodiments, the second sensing assembly 800 is at a corner of the optical element driving mechanism 1000 that is different from the corners of the optical element driving mechanism 1000 that the second driving assembly 700, the first guiding element 510, and the second guiding element 520 disposed on. For instance the second sensing assembly 800 may position at the third corner 143, the second driving assembly 700 and the first guiding element 510 may position at the first corner 141, and the second guiding element 520 may position at the second corner 142. As a result, the space at the corners of the optical element driving mechanism 1000 may be utilized to achieve miniaturization.

In some embodiments, the optical element driving mechanism 1000 may further include a 831 which may be packaged with the second sensing element 830 as one piece. In other words, the 831 may position at the third corner 143 and affixed on the second holder 300. The 831 may be electrically connected to the first circuit assembly 153. The second sensing assembly 800 may provide a second sensing signal to the 831, and then the 831 may provide a second driving signal to the second driving assembly 700 based on the second sensing signal to control the movement of the second driving assembly 700. The second sensing signal may include information related to the position of the second holder 300 relative to the bottom 400.

In some embodiments, the bottom 400 may further include a second circuit assembly 450 affixed in the bottom 400. The second circuit assembly 450 may be electrically connected to the second driving assembly 700 and the second sensing assembly 800, such as the second driving assembly 700 and the second sensing assembly 800 may be electrically connected to the first circuit assembly 153 and the 831 through the second circuit assembly 450. A first electrical connecting portion 151 and a second electrical connecting portion 152 may be between the first circuit assembly 153 and the second circuit assembly 450 for connecting the first circuit assembly 153 and the second circuit assembly 450. A portion of the second circuit assembly 450 may be exposed from the bottom 400.

For example, the first electrical connecting portion 151 and the second electrical connecting portion 152 may be used for transmitting the second driving signal and the second sensing signal. Moreover, the first electrical connecting portion 151 and the second electrical connecting portion 152 may position at different corners of the optical element driving mechanism 1000, such as the first electrical connecting portion 151 is at the first corner 141, and the second electrical connecting portion 152 is at the second corner 142 when viewed along the main axis 900, so the signals may be prevented from interference with each other.

In some embodiments, the fifth connecting element 465 may be disposed on the first electrical connecting portion 151, such as the fifth connecting element 465 covers the first electrical connecting portion 151 to protect the first electrical connecting portion 151. In some embodiments, the fifth connecting element 465 may be in direct contact with the second connecting element 462 and the third connecting element 463, such as the second connecting element 462, the third connecting element 463, and the fifth connecting element 465 may be formed as one piece to allow the second connecting element 462, the third connecting element 463, and the fifth connecting element 465 being provided in a single process to reduce the required steps of the process.

In some embodiments, the optical element driving mechanism 1000 may further include a dust limiting structure 470 to limit the movement of the dust in the accommodating space 130. The dust limiting structure 470 may include a first dust capturing element 471, a second dust capturing element 472, a third dust capturing element 473, and a fourth dust capturing element 474 used for capturing dust. The surfaces of first dust capturing element 471, the second dust capturing element 472, the third dust capturing element 473, and the fourth dust capturing element 474 may be sticky, such as the first dust capturing element 471, the second dust capturing element 472, the third dust capturing element 473, and the fourth dust capturing element 474 may include resin for capturing dusts.

It should be noted that the first recess structure 411 may be formed on the first bottom surface 401, and the second recess structure 310 may be formed on a surface of the second holder 300 facing the bottom 400. The first dust capturing element 471 may be disposed in the first recess structure 411, the second dust capturing element 472 may be disposed in the second recess structure 310, the third dust capturing element 473 may be disposed on the second bottom surface 402, and the fourth dust capturing element 474 may be disposed on the third bottom surface 403. As shown in FIG. 5A, the first dust capturing element 471 and the fourth dust capturing element 474 may surround the first opening 421 and the transferring element 710 disposed in the first opening 421 when viewed along the second axis 920. In other words, the first recess structure 411 may be adjacent to the transferring element 710.

In some embodiments, as shown in FIG. 4D, the first recess structure 411 may at least partially overlap the 412 in a direction that the second axis 920 extends, that is, the second dust capturing element 472 and the first dust capturing element 471 may at least partially overlap each other. Moreover, a maximum dimension L1 of the first recess structure 411 may be different from a maximum dimension L2 of the second recess structure 310 in the direction that the first axis 910 extends. For instance, the maximum dimension L1 of the first recess structure 411 may be higher than the maximum dimension L2 of the second recess structure 310 to ensure the first dust capturing element 471 does not overlap the entire second dust capturing element 472 in the Z direction to prevent the first dust capturing element 471 and the second dust capturing element 472 from stick with each other. Since the second dust capturing element 472 is disposed on the second holder 300 and the first dust capturing element 471 is disposed on the bottom 400, the second dust capturing element 472 may move relative to the first dust capturing element 471. In some embodiments, a gap greater than zero is between the center of the first dust capturing element 471 and the center of the third dust capturing element 473 along the second axis 920. When viewed along the second axis 920, the third dust capturing element 473 may enclose and surround the through hole 320 (i.e. enclose and surround the optical element).

In summary, an optical element driving mechanism is provided in some embodiments of the present disclosure. The optical element driving mechanism includes a first holder, a fixed portion, a first driving assembly, and a first stopping assembly. The first holder is used for connecting to an optical element. The first holder is movable relative to the fixed portion. The first driving assembly is used for driving the first holder to move relative to the fixed portion. The first stopping assembly is used for restricting the movable range of the first holder relative to the fixed portion. Therefore, auto focus and optical image stabilization may be achieved, and miniaturization may be reached.

The relative positions and size relationship of the elements in the present disclosure may allow the optical element driving mechanism achieving miniaturization in specific directions or for the entire mechanism. Moreover, different optical modules may be combined with the optical element driving mechanism to further enhance optical quality, such as the quality of photographing or accuracy of depth detection. Therefore, the optical modules may be further utilized to achieve multiple anti-vibration systems, so image stabilization may be significantly improved.

Although embodiments of the present disclosure and their advantages already have been described in detail, it should be understood that various changes, substitutions and alterations may be made herein without departing from the spirit and the scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are also intended to include within their scope of such processes, machines, manufacture, and compositions of matter, means, methods, or steps. In addition, each claim herein constitutes a separate embodiment, and the combination of various claims and embodiments are also within the scope of the disclosure.

What is claimed is:

1. An optical element driving mechanism, comprising:
    a first holder used for connecting to an optical element;
    a fixed portion, wherein the first holder is movable relative to the fixed portion, and the first holder and the fixed portion are arranged along a main axis;
    a first driving assembly used for driving the first holder to move relative to the fixed portion;
    a first stopping assembly used for restricting the movable range of the first holder relative to the fixed portion;
    a second holder used for connecting the optical element and is movable relative to the fixed portion and the first holder;
    a second driving assembly used for driving the second holder to move relative to the first holder; and
    a bottom affixed on the first holder,
    wherein:
        when viewed along a first axis perpendicular to the main axis, at least a portion of the bottom is between the first holder and the second holder;
        when viewed along the first axis, at least a portion of the second driving assembly is between the bottom and the first holder; and
        when viewed along the first axis, at least a portion of the second driving assembly is exposed from the bottom.

2. The optical element driving mechanism as claimed in claim 1, wherein the fixed portion comprises:
    a top wall being plate-shaped and perpendicular to the main axis;
    a first side wall being plate-shaped and does not parallel to the top wall; and
    a base arranged with the top wall along the main axis;
    wherein:
        the top wall, the first side wall, and the base surround an accommodating space, and the accommodating space is used for accommodating the first holder;
        at least a portion of the first driving assembly is affixed on the first holder.

3. The optical element driving mechanism as claimed in claim 2,
    wherein
        the bottom has a first concave structure used for accommodating the second driving assembly.

4. The optical element driving mechanism as claimed in claim 3, wherein the second driving assembly comprises:
    a driving force source used for generating a driving force;
    a transferring element used for transferring the driving force; and
    a weighting element disposed on the transferring element;
    wherein:
        the material of the driving force source comprises piezoelectric material;
        the material of the transferring element comprises non-metal materials;
        the transferring element is strip-shaped and extends in a second axis;
        the material of the weighting element comprises metal;
        the driving force source is between the transferring element and the weighting element;
        the transferring element is disposed in a first opening of the bottom;
        the first bottom is formed on a first bottom surface and a third bottom surface of the bottom;
        the first bottom surface and the third bottom surface are perpendicular the second axis;
        the first side wall and the base is adjacent to the first concave structure;
        the driving force source is in the first concave structure;
        the weighting element is in the first concave structure.

5. The optical element driving mechanism as claimed in claim 4, wherein:
    when viewed along the second axis, the maximum dimension of the first opening is different from the maximum dimension of the second opening;
    when viewed along the second axis, the maximum dimension of the first opening is less than the maximum dimension of the first guiding element;
    a first end of the guiding element is disposed in the second opening;

when viewed along the second axis, the maximum dimension of the first opening is greater than ⅓ of the maximum dimension of the first guiding element;
a second end of the guiding element is free from in contact with any element.

6. The optical element driving mechanism as claimed in claim 5, further comprising a guiding assembly used for guiding the movement of the second holder relative to the bottom, and the guiding assembly comprises:
   a first guiding element being strip-shaped and extending along in a direction parallel to the second axis; and
   a second guiding element being strip-shaped and extending along in a direction parallel to the second axis;
   wherein:
   when viewed along the second axis, the optical element driving mechanism is polygonal;
   when viewed along the second axis, the second driving assembly is position at a first corner of the optical element driving mechanism;
   when viewed along the second axis, the first guiding element is position at the first corner;
   when viewed along the second axis, the second guiding element is position at a second corner of the optical element driving mechanism;
   when viewed along the second axis, a connection between the first guiding element and the second guiding element passes a through hole of the second holder;
   the optical element is affixed in the through hole;
   when viewed along the first axis, at least a portion of the first guiding element overlaps the second driving assembly;
   a second opening forms on a second bottom surface of the bottom;
   the second opening forms on a fourth bottom surface of the bottom;
   the third bottom surface and the fourth bottom surface face the first holder;
   the second bottom surface and the fourth bottom surface are parallel;
   the bottom further includes a second concave structure formed on the second bottom surface and is adjacent to the second opening;
   when viewed along the main axis, the maximum dimension of the second concave structure is greater than the maximum dimension of the second opening;
   the second concave structure has a curvy surface;
   the bottom further comprises a third concave structure formed on the fourth bottom surface and is adjacent to the second opening;
   when viewed along the main axis, the maximum dimension of the third concave structure is different from the maximum dimension of the second concave structure;
   the third concave structure has a flat surface;
   when viewed along the second axis, the maximum dimension of the first opening is less than the maximum dimension of the second opening;
   the material of the transferring element comprises carbon.

7. The optical element driving mechanism as claimed in claim 6, further comprising:
   a first connecting element at least partially disposed in the first concave structure;
   a second connecting element at least partially disposed in the first concave structure;
   a third connecting element disposed between the bottom and the first holder; and
   a fourth connecting element used for connecting the transferring element and the bottom;
   wherein:
   the weighting element is affixed on a first concave structure surface through the first connecting element;
   the first connecting element is in direct contact with the weighting element;
   the first connecting element is in direct contact with the first recess structure surface;
   the first recess structure surface is parallel to the second axis;
   at least a portion of the first connecting element overlaps the weighting element in a direction perpendicular to the second axis;
   the weighting element is affixed on a second concave structure surface of the first concave structure through the second connecting element;
   the second connecting element is in direct contact with the weighting element;
   the second connecting element is in direct contact with the second recess structure surface;
   the second recess structure surface is not parallel to the second axis;
   when viewed along the second axis, at least a portion of the second connecting element overlaps the weighting element;
   the first recess structure surface is at the bottom;
   the second recess structure surface is at the first holder;
   the first connecting element is in direct contact with the second connecting element;
   the first connecting element and the second connecting element are formed as one piece;
   the bottom is affixed on the first holder through the third connecting element;
   the third connecting element is in direct contact with the first holder;
   the third connecting element is in direct contact with the bottom;
   at least a portion of the first guiding element overlaps the third connecting element in the direction that the second axis extends;
   the third connecting element is in direct contact with the first guiding element;
   at least a portion of the second guiding element overlaps the third connecting element in the direction that the second axis extends;
   the third connecting element is in direct contact with the second guiding element;
   the third connecting element is in direct contact with the second connecting element;
   the second connecting element and the third connecting element are formed as one piece;
   the material of the first connecting element comprises nonmetal material;
   the material of the second connecting element comprises nonmetal material;
   the material of the third connecting element comprises nonmetal material;
   the fourth connecting element is in direct contact with the bottom;
   the fourth connecting element is disposed in the first opening;
   the Young's modulus of the fourth connecting element is different from the Young's modulus of the second connecting element;
   the Young's modulus of the fourth connecting element is different from the Young's modulus of the third connecting element;

when viewed along the main axis, the maximum dimension of the third concave structure is greater than the maximum dimension of the second concave structure.

8. The optical element driving mechanism as claimed in claim 7, further comprising a second sensing assembly used for detecting the movement of the second holder relative to the bottom;
wherein:
when viewed along the main axis, the second driving assembly and the second sensing assembly are at different corners of the optical element driving mechanism;
when viewed along the main axis, the first guiding element and the second sensing assembly are at different corners of the optical element driving mechanism;
when viewed along the main axis, the second guiding element and the second sensing assembly are at different corners of the optical element driving mechanism;
when viewed along the main axis, the second driving assembly is at a third corner of the optical element driving mechanism;
the second sensing assembly comprises a second reference element and a second sensing element;
the second reference element and the second sensing element are respectively disposed on the second holder and the bottom;
the Young's modulus of the fourth connecting element is less than the Young's modulus of the second connecting element;
the Young's modulus of the fourth connecting element is less than the Young's modulus of the third connecting element.

9. The optical element driving mechanism as claimed in claim 8, further comprising:
a first circuit assembly affixed on the first holder; and
a second control assembly electrically connected to the first circuit assembly;
wherein:
the first circuit assembly is electrically connected to the first driving assembly;
the first circuit assembly is electrically connected to the second driving assembly;
the first circuit assembly is electrically connected to the second sensing assembly;
the second control assembly is used for providing as second driving signal to the second driving assembly;
the second sensing assembly provides a second sensing signal to the second control assembly;
when viewed along the second axis, the second control assembly is position at the third corner;
the second control assembly is affixed on the first holder.

10. The optical element driving mechanism as claimed in claim 9, further comprising:
a second circuit assembly affixed on the bottom;
a first electrical connecting portion connecting to the first circuit assembly and the second circuit assembly; and
a second electrical connecting portion connecting to the first circuit assembly and the second circuit assembly;
wherein:
the second circuit assembly is electrically connected to the second driving assembly;
the second circuit assembly is electrically connected to the second sensing assembly;
the second driving assembly is electrically connected to the first circuit assembly through the second circuit assembly;
the second sensing assembly is electrically connected to the first circuit assembly through the second circuit assembly;
the second driving assembly is electrically connected to the second control assembly through the first circuit assembly;
the second sensing assembly is electrically connected to the second control assembly through the first circuit assembly;
the second driving signal is transmitted through the first electrical connecting portion;
the second sensing signal is transmitted through the second electrical connecting portion;
when viewed along the main axis, the first electrical connecting portion and the second electrical connecting portion are position at different corners of the optical element driving mechanism.

11. The optical element driving mechanism as claimed in claim 10, further comprising a fifth connecting element disposed on the first electrical connecting portion;
wherein:
the fifth connecting element is in direct with the second connecting element;
the fifth connecting element is in direct with the third connecting element;
the fifth connecting element and the second connecting element are formed as one piece;
the fifth connecting element and the third connecting element are formed as one piece;
the material of the first holder comprises metal;
the material of the second holder comprises nonmetal materials;
the material of the first driving assembly comprises shape memory alloy;
when viewed along the main axis, the first electrical connecting portion is at the first corner;
when viewed along the main axis, the second electrical connecting portion is at the second corner.

12. The optical element driving mechanism as claimed in claim 11, further comprising a dust limiting structure used for limiting the movement of dust in the accommodating space, and the dust limiting structure comprises:
a first dust capturing element used for capturing the dust;
a second dust capturing element used for capturing the dust; and
a third dust capturing element used for capturing the dust;
wherein:
the bottom further comprises a first recess structure formed on the first bottom surface;
the second holder further comprises a second recess structure formed on the surface of the second holder facing the bottom;
the surface of the first dust capturing element is sticky;
the material of the first dust capturing element comprises resin;
when viewed along the second axis, the first dust capturing element surrounds the transferring element;
the first recess structure is adjacent to the transferring element;
the first dust capturing element is disposed in the first recess structure;
in the direction that the first axis extends, the maximum dimension of the first recess structure is different from the maximum dimension of the second recess structure;
in the direction that the second axis extends, at least a portion of the first recess structure overlaps the second recess structure;

the second dust capturing element is movable relative to the first dust capturing element;

when viewed along the second axis, the first dust capturing element and the second dust capturing element at least partially overlap each other;

the third dust capturing element is disposed on the third bottom surface;

a gap greater than zero is between the center of the first dust capturing element and the center of the third dust capturing element in a direction parallel to the second axis;

the third dust capturing element surrounds the optical element when viewed along the second axis.

13. The optical element driving mechanism as claimed in claim 12, wherein the first stopping assembly comprises:

a first stopping element used for limiting the movement of the first holder; and a second stopping element used for limiting the movement of the second holder;

wherein:

when viewed along the main axis, the bottom comprises a first concave portion, and the first concave portion and the first stopping element are position at an identical side of the bottom;

the first concave portion corresponds to the first side wall;

the first stopping element is formed on the bottom;

when viewed along the main axis, the second stopping element is at the second corner;

when viewed along the main axis, the second stopping element and the second driving assembly are at different corners of the optical element driving mechanism;

the second stopping element is formed on the bottom;

the second sensing element is disposed on the second stopping element;

in the direction that the first axis extends, the maximum dimension of the first recess structure is less than the maximum dimension of the second recess structure.

* * * * *